(12) United States Patent
Shih et al.

(10) Patent No.: US 7,701,750 B2
(45) Date of Patent: Apr. 20, 2010

(54) PHASE CHANGE DEVICE HAVING TWO OR MORE SUBSTANTIAL AMORPHOUS REGIONS IN HIGH RESISTANCE STATE

(75) Inventors: Yen-Hao Shih, Banqiao (TW); Chieh Fang Chen, Panchiao (TW); Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 167 days.

(21) Appl. No.: 12/117,164

(22) Filed: May 8, 2008

(65) Prior Publication Data
US 2009/0279349 A1    Nov. 12, 2009

(51) Int. Cl.
*G11C 11/00* (2006.01)
(52) U.S. Cl. .................. 365/148; 365/100; 365/189.09; 365/177; 365/196
(58) Field of Classification Search .................. 365/100, 365/189.09, 148, 177, 196
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |

(Continued)

FOREIGN PATENT DOCUMENTS

| | | |
|---|---|---|
| WO | WO-0079539 | 12/2000 |
| WO | WO-0145108 | 6/2001 |
| WO | WO-0225733 | 3/2002 |

OTHER PUBLICATIONS

"Magnetic Bit Boost," www.sciencenews.org, Dec. 18 & 25, 2004, p. 389, vol. 166.

(Continued)

*Primary Examiner*—Thong Q Le
(74) *Attorney, Agent, or Firm*—Haynes Beffel & Wolfeld LLP

(57) ABSTRACT

Memory devices are described herein along with method for operating the memory device. A memory cell as described herein includes a first electrode and a second electrode. The memory cell also comprises phase change material having first and second active regions arranged in series along an inter-electrode current path between the first and second electrode.

26 Claims, 21 Drawing Sheets

U.S. PATENT DOCUMENTS

| | | |
|---|---|---|
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |

| Patent/Pub No. | Date | Inventor |
|---|---|---|
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0133270 A1 | 6/2007 | Jeong et al. |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |

| | | | |
|---|---|---|---|
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2008/0310208 | A1* | 12/2008 | Daley .................... 365/148 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403- 413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μ Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

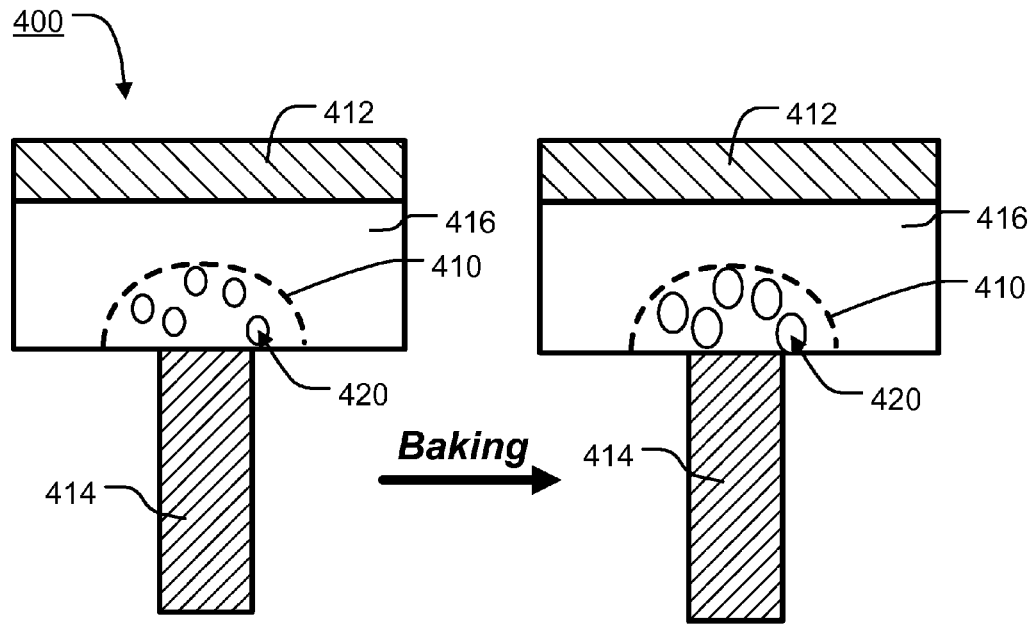
FIG. 4A
(Prior Art)
FIG. 4B
(Prior Art)
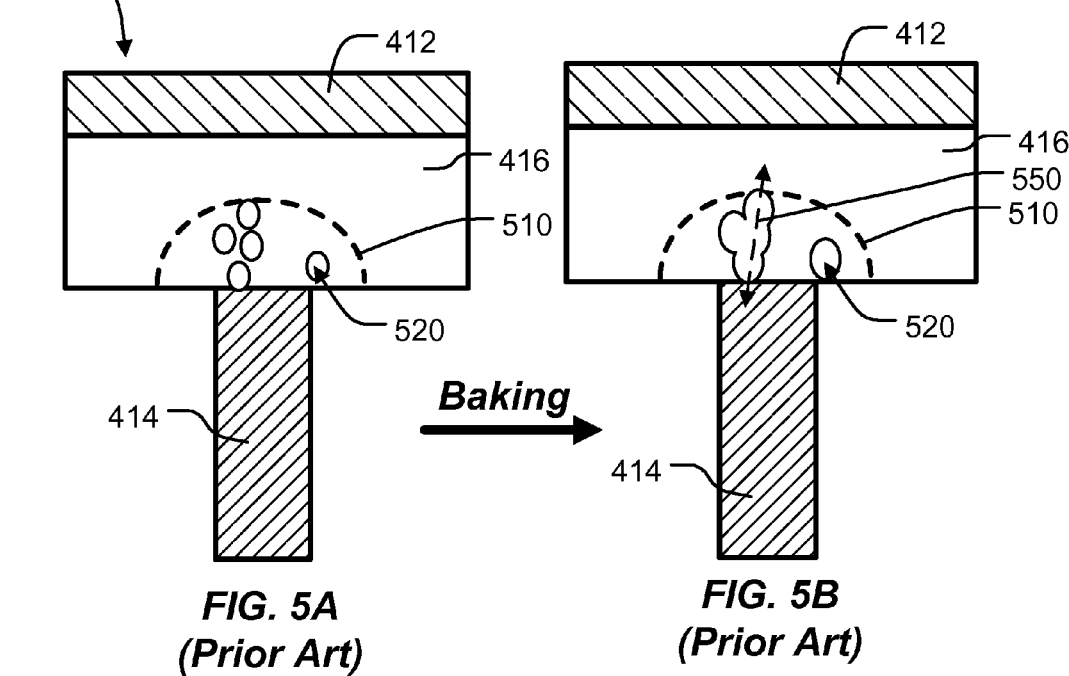
FIG. 5A
(Prior Art)
FIG. 5B
(Prior Art)

PHASE CHANGE DEVICE HAVING TWO OR MORE SUBSTANTIAL AMORPHOUS REGIONS IN HIGH RESISTANCE STATE

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and methods for operating such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

In phase change memory, data is stored by causing transitions in an active region of the phase change material between amorphous and crystalline states. FIG. 1 is a graph of memory cells having one of two states (storing a single bit of data), a low resistance set (programmed) state 100 and a high resistance reset (erased) state 102 each having non-overlapping resistance ranges.

The difference between the highest resistance $R_1$ of the low resistance set state 100 and the lowest resistance $R_2$ of the high resistance reset state 102 defines a read margin 101 used to distinguish cells in the set state 100 from those in the reset state 102. The data stored in a memory cell can be determined by determining whether the memory cell has a resistance corresponding to the low resistance state 100 or to the high resistance state 102, for example by measuring whether the resistance of the memory cell is above or below a threshold resistance value $R_{SA}$ 103 within the read margin 101.

In order to reliably distinguish between the reset state 102 and the set state 100, it is important to maintain a relatively large read margin 101. However, it has been observed that some phase change memory cells in the reset state 102 will experience an erratic "tailing bit" effect in which the resistance of the memory cell decreases over time to below the threshold resistance value $R_{SA}$ 103, resulting in data retention problems and bit errors for those memory cells. Error Correction Coding (ECC) may be used to address the tailing bit issues, but may result in penalties regarding write efficiency, read speed, and chip size.

It is desirable therefore to provide a memory cell structure and methods for operating such structures which address these data retention issues without ECC and result in improved data storage performance.

SUMMARY OF THE INVENTION

A memory device as described herein includes a memory cell comprising a first electrode, a second electrode, and phase change material having first and second active regions arranged in series along an inter-electrode current path between the first electrode and the second electrode. The memory device includes bias circuitry adapted to apply bias arrangements to the memory cell to store a bit. The bias arrangements include a first bias arrangement adapted to establish a high resistance state in the memory cell by inducing a high resistance condition in both the first and second active regions to store a first value of the bit in the memory cell. The high resistance state has a minimum resistance indicating that at least one of the active regions is in the high resistance condition. The bias arrangements also include a second bias arrangement adapted to establish a low resistance state in the memory cell by inducing a low resistance condition in both of the first and second active regions to store a second value of the bit in the memory cell. The low resistance state has a maximum resistance indicating that both the first and second active regions are in the low resistance condition. The memory device also includes sense circuitry to sense the value of the bit in the memory cell by determining if the memory cell has a resistance corresponding to the low resistance state or to the high resistance state.

A method is described herein for operating a memory cell comprising a first electrode, a second electrode, and phase change material having first and second active regions arranged in series along an inter-electrode current path between the first and second electrode. The method includes determining a data value of a bit to be stored in the memory cell. A first bias arrangement is applied to the memory cell if the data value is a first value, the first bias arrangement adapted to establish a high resistance state in the memory cell by inducing a high resistance condition in both the first and second active regions to store the first value of the bit. The high resistance state having a minimum resistance indicating that at least one of the active regions is in the high resistance condition. A second bias arrangement is applied if the data value is a second value, the second bias arrangement adapted to establish a low resistance state in the memory cell by inducing a low resistance condition in both the first and second active regions to store the second value of the bit. The method includes determining the data value of the bit stored in the memory cell by determining whether the memory cell has a resistance corresponding to the low resistance state or to the high resistance state.

Since the high resistance state of the memory cell has a minimum resistance indicating that at least one of the active regions is in the high resistance condition, the present invention allows the data value stored to be determined even if one of the active regions experiences the tailing bit effect. Thus, the tailing bit failure rate of an array of memory cells can be significantly reduced without the use of ECC.

Other aspects and advantages of the present invention can be seen on review of the drawings, the detailed description, and the claims which follow.

BRIEF DESCRIPTION OF THE DRAWINGS

FIGS. 4-5 illustrate a possible early fail model for the tailing bit effect of memory cells in reset.

DETAILED DESCRIPTION

Figure 1:
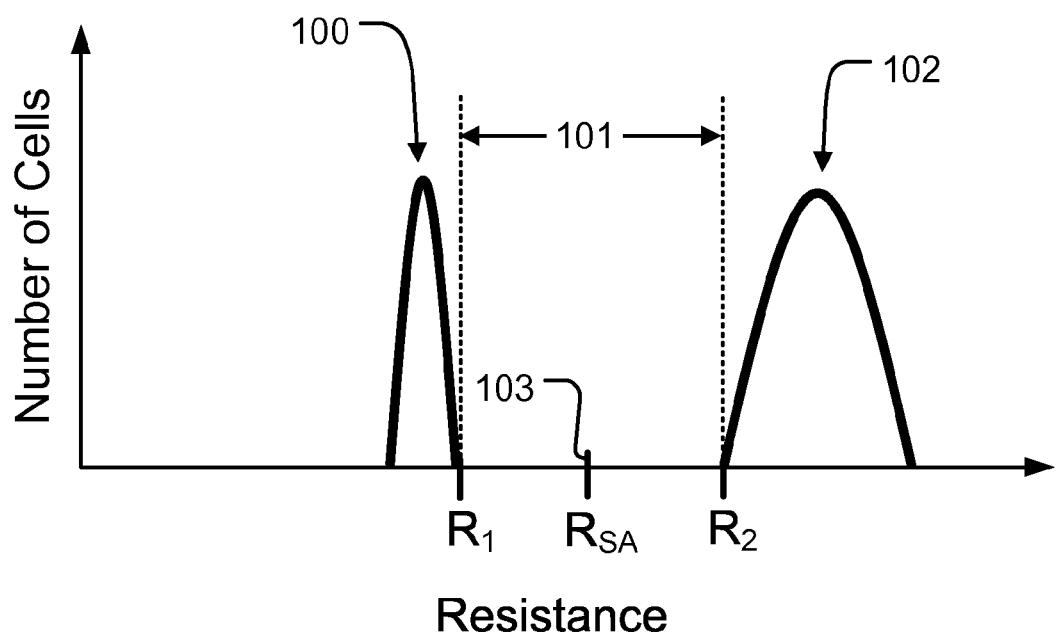
FIG. 1 is a graphical distribution of memory cells having one of two states, a low resistance set state and a high resistance reset state.

The following description of the invention will refer to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope. Those of ordinary skill in the art will recognize a variety of equivalent variations on the description that follows. Like elements in various embodiments are commonly referred to with like reference numerals.

Figure 2A:
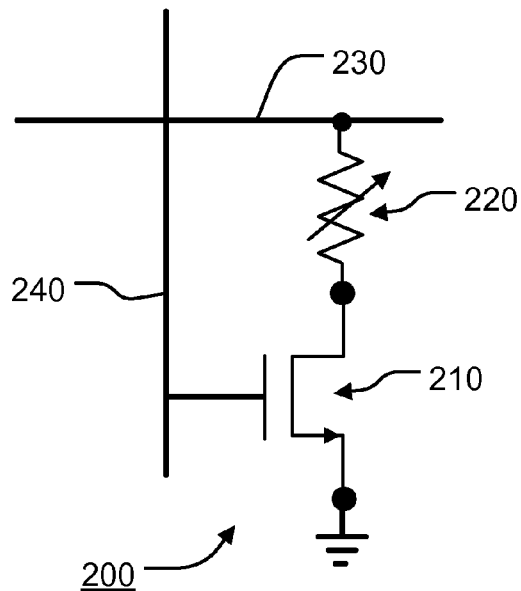
FIGS. 2A-2C illustrate schematic diagrams of three prior art phase change memory cells having a phase change material memory element with a single active region.
Figure 2B:
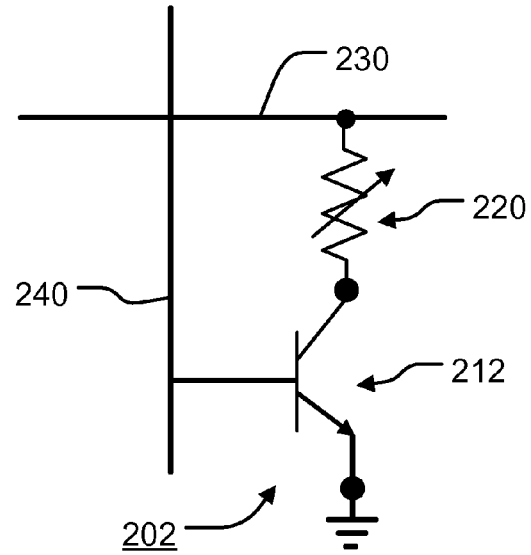
Figure 2C:
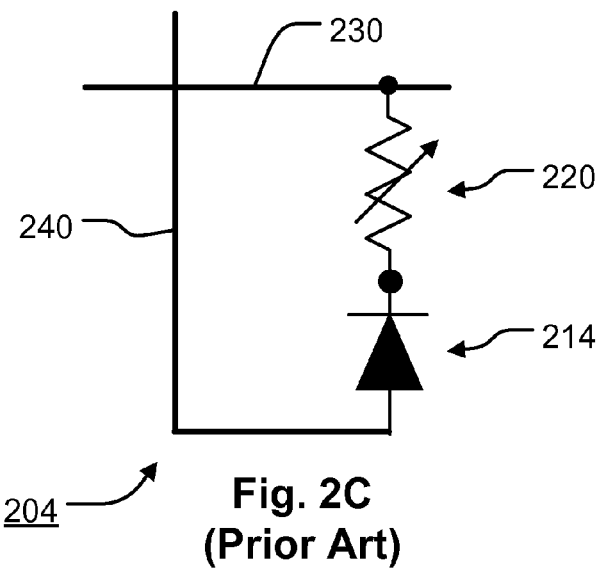

FIGS. 2A-2C illustrate schematic diagrams of three prior art phase change memory cells each having a phase change material memory element 220 with a single active region (represented in the Figures by a variable resistor) and coupled to a select device such as a transistor or diode.

FIG. 2A illustrates a schematic diagram of a prior art memory cell 200 including a field effect transistor (FET) 210 as the select device. A word line 240 extending in a first direction is coupled to the gate of the FET 210 and a memory element 220 couples the drain of the FET 210 to a bit line 230 extending in a second direction.

FIG. 2B illustrates a schematic diagram of memory cell 202 similar to that of FIG. 2A except that the access device is implemented as a bipolar junction transistor (BJT) 212, while FIG. 2C illustrates a schematic diagram of a memory cell 204 similar to that of FIG. 2A except the access device is implemented as a diode 214.

Reading or writing can be achieved by applying suitable voltages to the word line 240 and bit line 230 to induce a current through the memory element 220. The level and duration of the voltages applied is dependent upon the operation performed, e.g. a reading operation or a writing operation.

FIGS. 3A-3E illustrate cross-sectional views of prior art configurations for memory element 220.

Figure 3A:
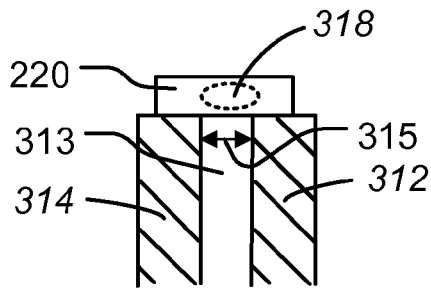
FIGS. 3A-3E illustrate cross-sectional views of prior art configurations for the memory element.

FIG. 3A is a simplified cross-sectional view illustrating a first configuration for memory element 220 coupled to first and second electrodes 312, 314. The first electrode 312 may, for example, be coupled to a terminal of an access device such as a diode or transistor, while the second electrode 314 may be coupled to a bit line.

A dielectric spacer 313 having a width 315 separates the first and second electrodes 312, 314. The phase change material of memory element 220 extends across the dielectric spacer 313 and contacts the first and second electrodes 312, 314, thereby defining an inter-electrode path between the first and second electrodes 312, 314 having a path length defined by the width 315 of the dielectric spacer 313. In operation, as current passes between the first and second electrodes 312, 314 and through the memory element 220, the active region 318 of the phase change material of the memory element 220 heats up more quickly than the remainder of the memory element 220.

Figure 3B:
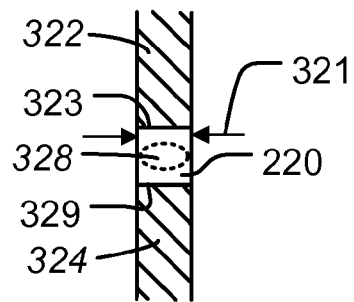

FIG. 3B is a simplified cross-sectional view illustrating a second configuration for memory element 220 coupled to first and second electrodes 322, 324. The phase change material of the memory element 220 has an active region 328 and contacts the first and second electrodes 322, 324 at top and bottom surfaces 323, 329 respectively. The memory element 220 has a width 321 the same as that of the first and second electrodes 322, 324.

Figure 3C:
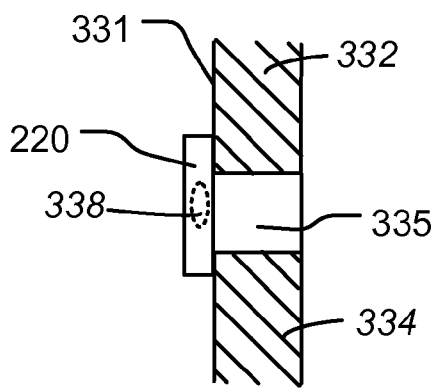

FIG. 3C is a simplified cross-sectional view illustrating a third configuration for memory element 220 coupled to first and second electrodes 332, 334, the phase change material of memory element 220 having an active region 338. The first and second electrodes 332, 334 are separated by dielectric spacer 335. The first and second electrodes 332, 334 and the dielectric spacer 335 have a sidewall surface 331. The phase change material of memory element 220 is on the sidewall surface 331 and extends across the dielectric spacer 335 to contact the first and second electrodes 332, 334.

Figure 3D:
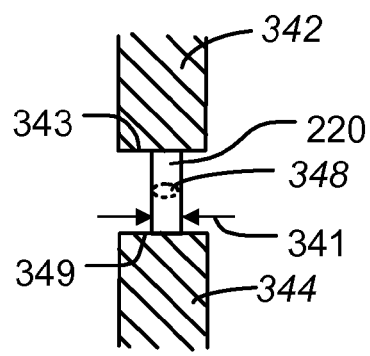

FIG. 3D is a simplified cross-sectional view illustrating a fourth configuration for memory element 220 coupled to first and second electrodes 342, 344. The phase change material of memory element 220 has an active region 348 and contacts the first and second electrodes 342, 344 at top and bottom surfaces 343, 349 respectively. The memory element 220 has a width 341 less than that of the first and second electrodes 342, 344.

Figure 3E:
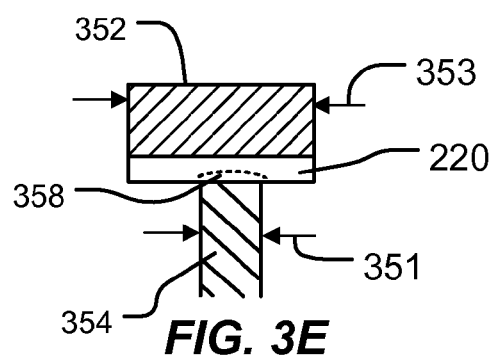

FIG. 3E is a simplified cross-sectional view illustrating a fifth configuration for memory element 220 coupled to first and second electrodes 354, 352. The first electrode 354 has a width 351 less than width 353 of the second electrode 352 and memory element 220. Because of the difference between width 351 and width 353, in operation the current density in the phase change material of memory element 220 is largest in the region adjacent the first electrode 354, resulting in the active region 358 having a "mushroom" shape as shown in the Figure.

As was described above, in an array some of the memory cells in the high resistance reset state will experience a tailing bit effect in which those memory cells undergo a reduction in resistance, resulting in data retention issues and bit errors.

Illustrated in FIGS. 4 and 5 is a possible early fail model for the trailing bit effect of memory cells in reset. Since the initial reset resistance of memory cells experiencing the tailing bit effect is high, a small or otherwise defective active region is not believed to be the likely cause. Instead, in the early fail model illustrated in FIGS. 4 and 5 a random distribution of crystallized regions within the generally amorphous active region will undergo growth during baking. For memory cells experiencing the tailing bit effect the random arrangement of the crystallized regions results in the need for very little growth before a low resistance path through the active region is formed.

FIG. 4A illustrates a "mushroom type" memory cell 400 having top and bottom electrodes 412, 414 and a memory element 416 comprising phase change material. In reset the memory element 416 has a generally amorphous active region 410 and a random distribution of crystalline regions 420 within the active region 410. As shown in FIG. 4B, after baking the crystalline regions 420 within the active region 410 will experience growth but do not form a complete low resistance path through the active region 410. Thus, although the memory cell illustrated in FIGS. 4A and 4B may experience some reduction in resistance, it does not experience the tailing bit effect.

FIGS. 5A and 5B illustrate a memory cell 500 having a random distribution of crystalline regions 520 within the active region 510 such that after baking a low resistance path 550 is formed through the active region 510 as shown in FIG. 5B, resulting in the memory cell of FIGS. 5A and 5B experiencing the tailing bit effect.

Figure 6:
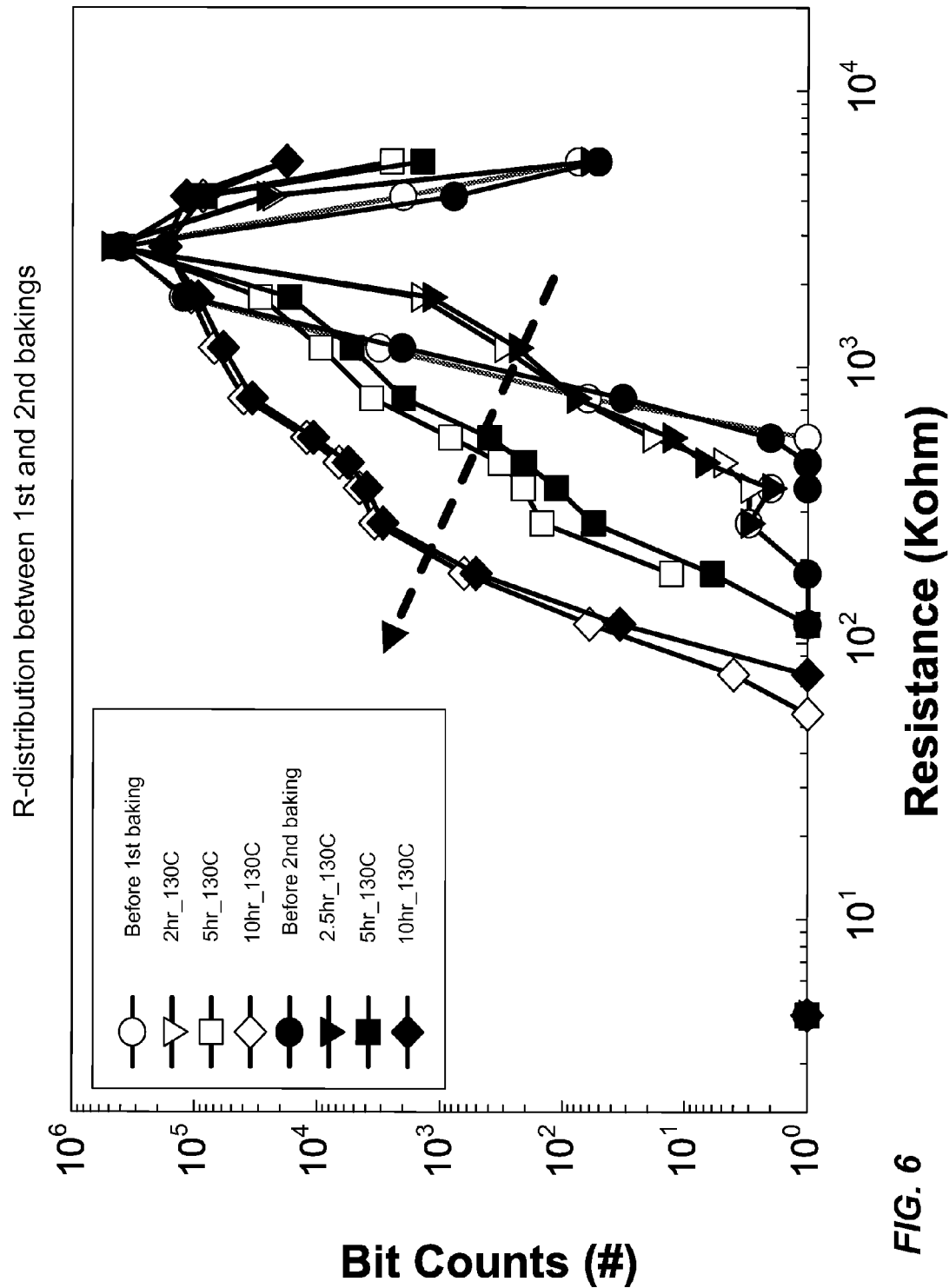
FIG. 6 is a graph of measured resistance data of memory cells in the reset state further illustrating the tailing bit effect.

FIG. 6 is a graph of measured resistance data of memory cells in the high resistance reset state further illustrating the tailing bit effect. The memory cells in the reset state initially have a resistance distribution as given by the curve labeled "Before 1st baking". As can be seen in the Figure, baking at 130° C. results in some of the memory cells experiencing the tailing bit effect, with increased baking time causing an increase in the number of memory cells at the low resistance tail (the left most portion of the curve) of the resistance distribution.

After the first baking of the memory cells a reset operation is performed to reset the memory cells to the high resistance state, the resulting resistance distribution of the cells as shown by the curve labeled "Before 2nd baking" and being substantially the same as the curve "Before 1st Baking". As can be seen in the Figure, a second baking at 130° C. results in a very similar number of memory cells experiencing the tailing bit effect as the first baking, with increased baking time again causing an increase in the number of memory cells at the low resistance tail of the resistance distribution.

As shown in FIG. 6, the resistance distributions of the cells after the first and second baking for each of the various baking times are very similar. However, as described in more detail below with reference to FIGS. 7 and 8, it has been observed that the cells which experience the tailing bit effect during the first baking are not necessarily the same cells which experience the tailing bit effect during the second baking, indicating a randomness as to whether or not a given memory cell will experience the tailing bit effect.

Figure 7:
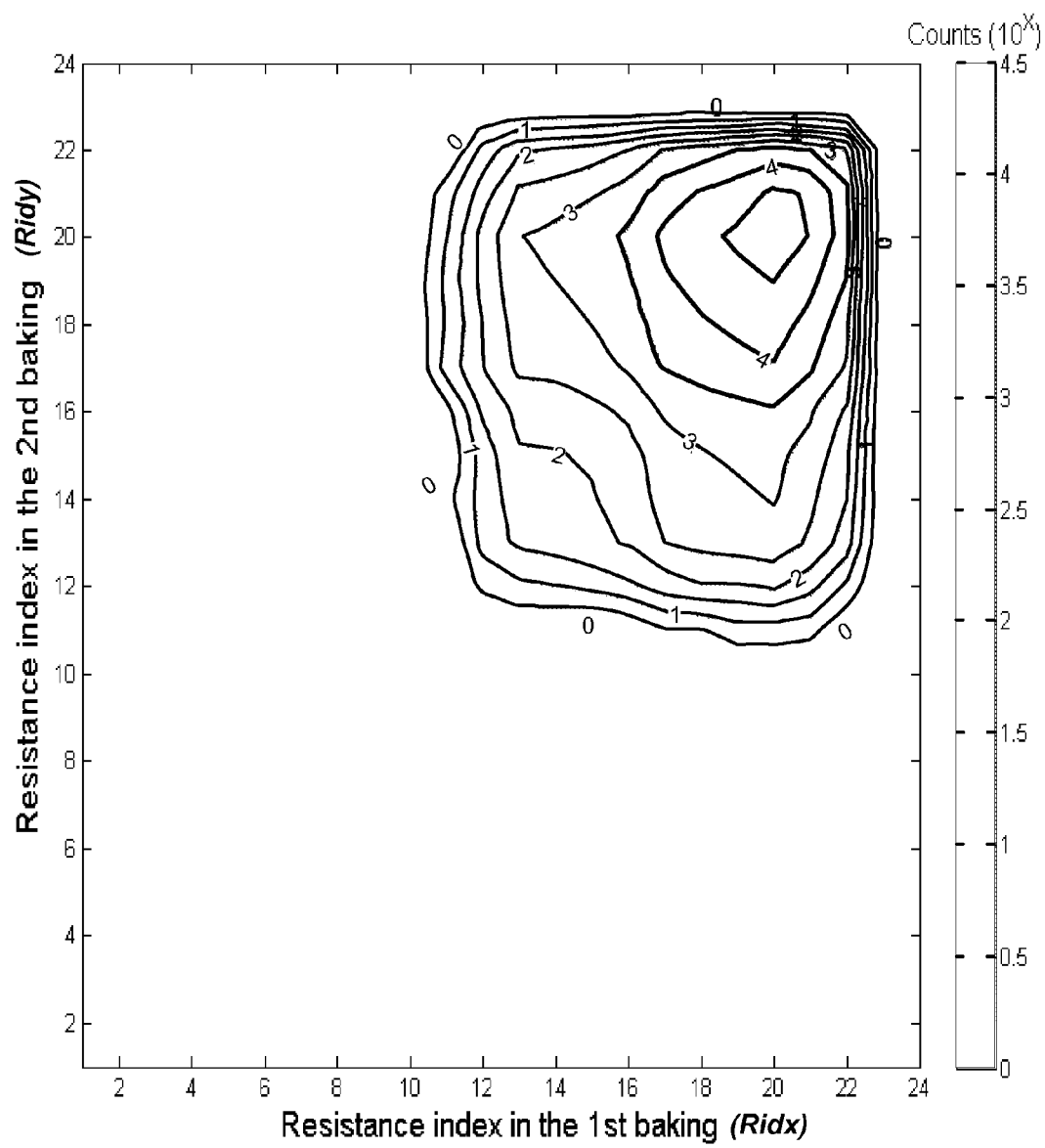
FIG. 7 is a three-dimensional contour plot showing the distribution of the resistance of the memory cells after the first baking and the second baking.

FIG. 7 is a three-dimensional contour plot showing the distribution of the resistance of the memory cells after the first baking and the second baking of 10 hours at 130° C. respectively.

After the first baking the memory cells were assigned a first resistance index Ridx based on the measured resistance of the cell, with each first resistance index Ridx being associated with one non-overlapping resistance range and arranged in order from lowest to highest resistance.

After the reset operation and the second baking, the resistance of each of the memory cells were again measured and assigned a second resistance index Ridy based on the resistance of the cell after the second baking, where each second resistance index Ridy is associated with the same resistance range as the corresponding Ridx (for example, Ridx=20 and Ridy=20 are associated with the same resistance range).

As can be seen in the Figure, even though each of the memory cells in a given Ridx had a resistance within the associated resistance range after the first baking, those same memory cells had a resistance distribution over a range of Ridy's after the second baking.

The range of Ridy's for the memory cells assigned a given Ridx demonstrates the apparent randomness of the trailing bit effect. For example, some of the memory cells having a low Ridx have a high Ridy which indicates that some memory cells which experienced the trailing bit effect in the first baking do not experience it in the second baking. Additionally, some of the memory cells having a high Ridx have a low Ridy which indicates that some of the memory cells which did not experience the trailing bit effect in the first baking do experience it in the second baking.

Figure 8A:
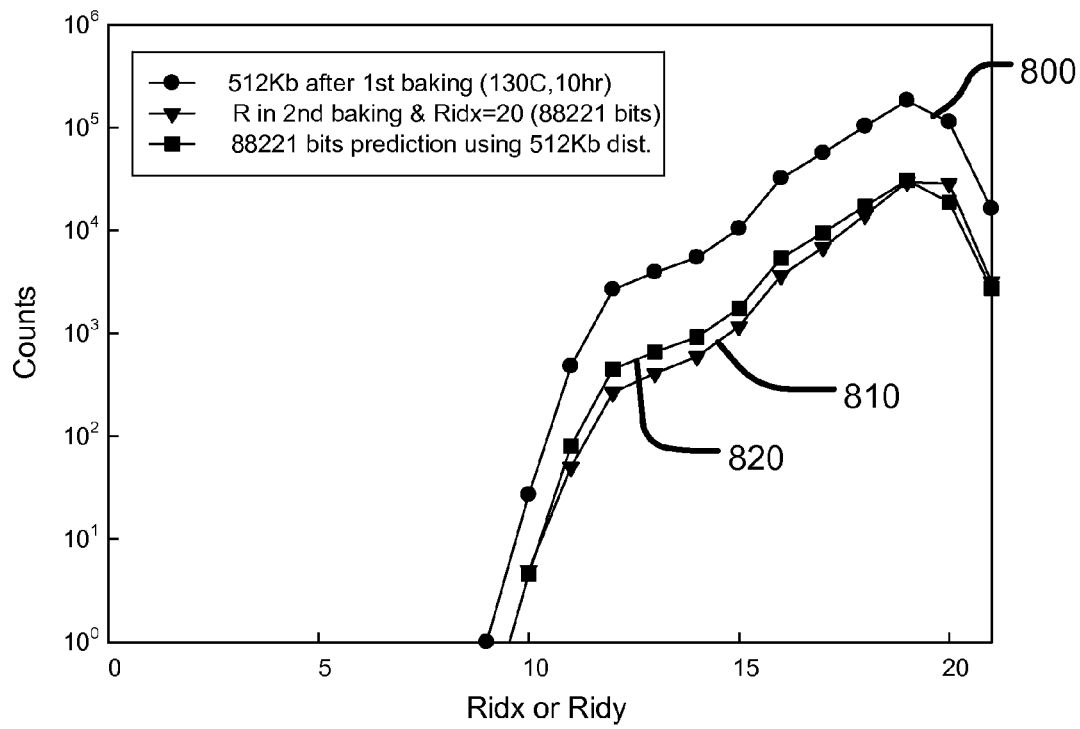
FIG. 8A-8B illustrate the resistance distributions further demonstrating the randomness of the tailing bit effect.

The randomness of the tailing bit effect is further illustrated in FIG. 8A, showing the resistance distribution 800 of the memory cells of the 512 Kb array arranged by first resistance index Ridx after the first baking at 130° C. for 10 hours.

FIG. 8A also includes the Ridy resistance distribution 810 after the second baking of the 88,221 memory cells having a first resistance index of Ridx=20. As can be seen, the distribution 810 shows that even though all of the 88,221 memory cells had a resistance after the first baking within the resistance range associated with Ridx=20 (and thus none of the cells experienced the trailing bit effect), after the second baking those same 88,221 memory cells had a resistance distribution 810 over the range of at least Ridy=10 to Ridy=21, including some memory cells which experienced the trailing bit effect.

Also shown in FIG. 8A is the predicted probability distribution 820 of 88,221 memory cells after the second baking using only the distribution 800 of the 512 Kb array. As can be seen in the Figure the predicted distribution 820 matches the actual distribution 810 of Ridx=20, demonstrating that the resistance distribution after baking can be accurately predicted based on previous distributions. This also demonstrates the randomness of the trailing bit effect within an array since it shows that the distribution and thus the probability of a tailing bit is a function of baking time, and appears independent of the resistance of those cells in a previous reset state.

Figure 8B:
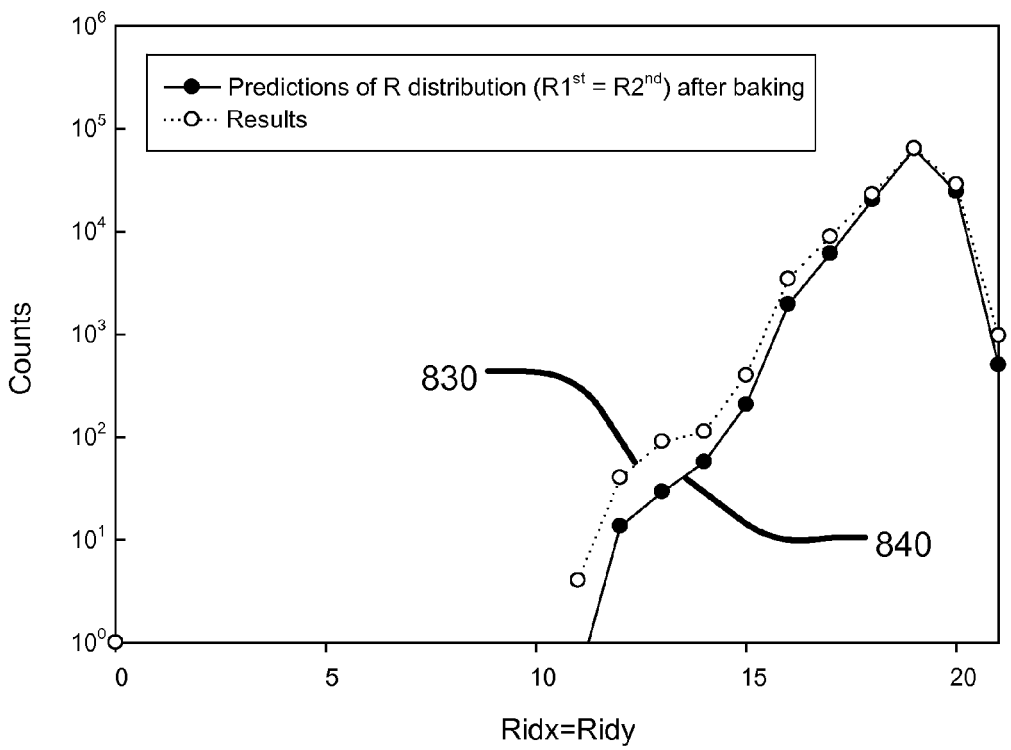

Distribution 830 of FIG. 8B shows the number of memory cells in the array which have a resistance after the second baking which falls within the same resistance range as that after the first baking. For example, the number of cells at data point Ridx=Ridy=20 for distribution 830 are the number of memory cells which had a resistance associated with Ridx=20 after the first baking and also had a resistance associated with Ridy=20 after the second baking, where Ridx=20 and Ridy=20 cover the same resistance range as described above.

FIG. 8B also shows the predicted distribution 840 of memory cells in the array which will have a resistance after the second baking which falls within the same resistance range as that after the first baking, the distribution 840 using the probability from distribution 800 of FIG. 8A. The predicted distribution 840 further demonstrates that the resistance distribution of the array and the probability of a memory cell experiencing the tailing bit effect is a function of the baking time, and is independent of the resistance of the cells in a previous reset state.

Figure 9:
FIG. 9 is a map of the array with the dots on the map representing the location of the memory cells which experienced a difference in the ratio of the resistance after the first baking and the second baking of greater than 10.

FIG. 9 is a map of the array with the dots on the map representing the location of the memory cells which experienced a difference in the ratio of the resistance after the first baking and second baking of greater than 10 ($|R_{1st}/R_{2nd}|>10$). As can be seen in FIG. 9, the location of the memory cells which experience such a difference in resistance is randomly distributed throughout the array.

The erratic behavior of the tailing bit effect results in data retention issues and bit errors for phase change memory cell arrays. Error Correction Coding (ECC) may be used to address the tailing bit issues, but may result in penalties regarding write efficiency, read speed, and chip size. It is desirable therefore to provide a memory cell structure and methods for operating such structures which address these data retention issues without ECC and result in improved data storage performance.

Figure 10A:
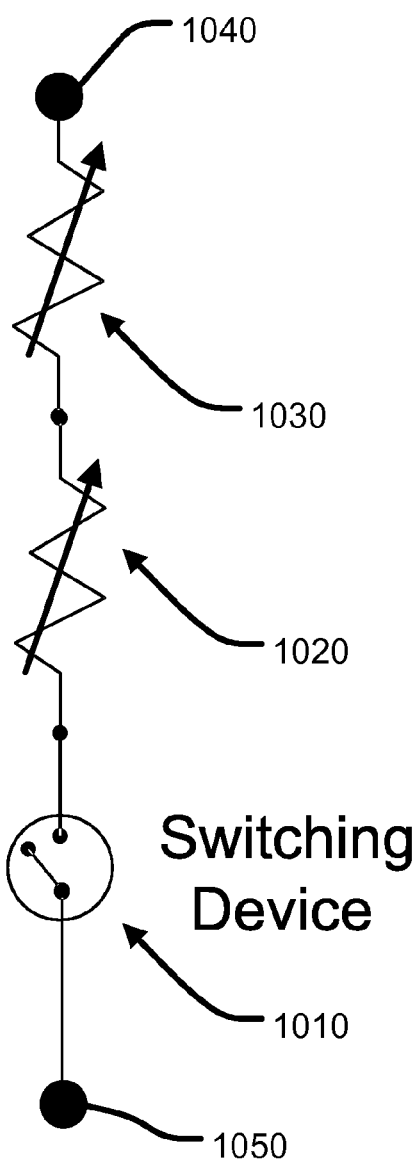
FIGS. 10A-10B illustrate schematic diagrams of memory cells having two active regions arranged in series with a switching device.
Figure 10B:
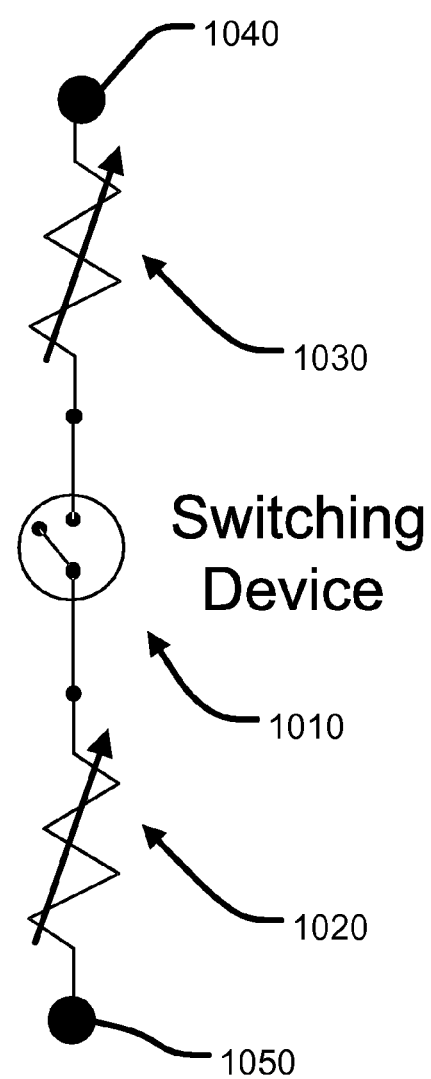

FIGS. 10A and 10B illustrate schematic diagrams of memory cells having two active regions arranged in series with a switching device (access device) along an inter-electrode current path between first and second electrodes, the memory cells of FIGS. 10A and 10B addressing the tailing bit issues described above and resulting in improved data retention and reduced bit errors.

The memory cells of FIGS. 10A-10B include a switching or access device (such as a diode or transistor) 1010, first and second active regions 1020, 1030, and first and second electrodes 1040, 1050. The first and second active regions 1020, 1030 and the switching device 1010 are arranged in series along an inter-electrode current path between first and second electrodes 1040, 1050 so that the same electrical current passes through each. In operation bias circuitry (See, for example, bias circuitry voltage and current sources 1236 of FIG. 12) coupled to the first and second electrodes 1040, 1050 applies bias arrangements to the memory cell to store a single bit. The bias arrangements include a first bias arrangement so that current flows along the inter-electrode path sufficient to induce a high resistance condition (generally amorphous state) in both the first and second active regions 1020, 1030 to establish a high resistance state in the memory cell to store a first value of the bit in the memory cell. The bias arrangements include a second bias arrangement so that current flows along the inter-electrode path sufficient to induce a low resistance condition (generally crystalline state) in both the first and second active regions 1020, 1030 to establish a low resistance state in the memory cell to store a second value of the bit in the memory cell. Thus, the first and second active regions 1020, 1030 are both induced to a generally amorphous (high resistance) state when the memory cell is in the high resistance reset state, and both the first and second active regions 1020, 1030 are both induced to a generally crystalline (low resistance) state when the memory cell is in a low resistance programmed state.

The high resistance state of the memory cell has a minimum resistance indicating that at least one of the active regions 1020, 1030 is in the high resistance condition, and the low resistance state of the memory cell has a maximum resistance indicating that both the first and second active regions 1020, 1030 are in the low resistance condition.

Sense circuitry (See, for example sense circuitry 1224 of FIG. 12) coupled to the memory cell senses the value of the bit in the memory cell by determining whether the memory cell has a resistance corresponding to the low resistance state or to the high resistance state. The value of the bit may be determined, for example, by comparison of current in the inter-electrode path to that of a suitable reference current by sense amplifiers of the sense circuitry.

Since the high resistance state of the memory cell has a minimum resistance indicating that at least one of the active regions 1020, 1030 is in the high resistance condition, the data value stored in the memory cell can be determined even if one of the active regions 1020, 1030 experiences the tailing bit effect.

In the memory cell of FIG. 10A the first active region 1020 is arranged along the inter-electrode current path between the switching device 1010 and the second active region 1030, while in the memory cell of FIG. 10B the switching device 1010 is arranged along the inter-electrode current path between the first and second active regions 1020, 1030.

Since the active regions 1020, 1030 are both in a generally amorphous state when the memory cell is in a reset state, by arranging the active regions 1020, 1030 in series and spacing them apart from each other the tailing bit failure rate of an array of memory cells can be significantly reduced (by more than $10^4$ in some instances) without the use of ECC. For example, if the memory cell is in the reset state and one of the active regions experiences the tailing bit effect, the series arrangement results in the other active region "guarding" the reset state of the memory cell. Thus, if each active region has an independent probability P (P<1) of experiencing the tailing bit effect, arranging the two active regions in series reduces the probability of the memory cell experiencing the tailing bit effect to $P^2$. Additionally, it will be understood that the probability of a memory cell experiencing the tailing bit effect will be reduced even in instances in which there is some correlation between the tailing bit effects of the two (or more) active regions.

In the schematic diagrams of FIGS. 10A and 10B the memory cells have two active regions are arranged series. However, it will be understood that the present invention generally includes memory cells having two or more active regions arranged in series. For a memory cell having N (N>1) active regions arranged in series and if each active region has an independent probability of P (P<1) of experiencing the tailing bit effect, the probability of the memory cell experiencing the tailing bit effect is reduced to $P^N$.

Figure 11A:
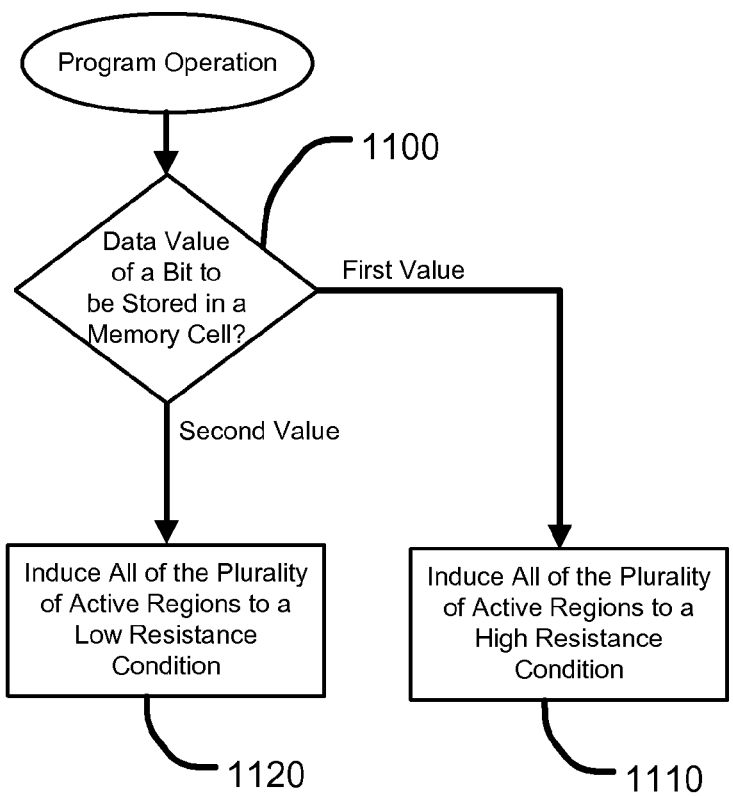
FIG. 11A illustrates a method for programming a memory cell having a plurality of active regions arranged in series along an inter-electrode path.

FIG. 11A illustrates a method for programming a memory cell having a plurality of active regions arranged in series along an inter-electrode current path, the method addressing the issues of the tailing bit effect and resulting in improved data retention.

At step 1100 a data value of a bit of data to be stored in a selected memory cell is determined. If the data value of the bit to be stored in the memory cell is a first data value, at step 1110 all of the plurality of active regions are set to a high resistance generally amorphous condition to establish a high resistance state in the memory cell. Instead, if the data value of the bit to be stored in the memory cell is a second data value, at step 1120 all of the plurality of active regions are set to a low resistance generally crystalline condition to establish a low resistance state in the memory cell.

Since all of the active regions have been set to a high resistance condition when the high resistance state of the memory cell is established, the series arrangement of the active regions allows the memory cell to maintain a relatively high resistance so long as at least one of the active regions maintains the high resistance state.

Figure 11B:
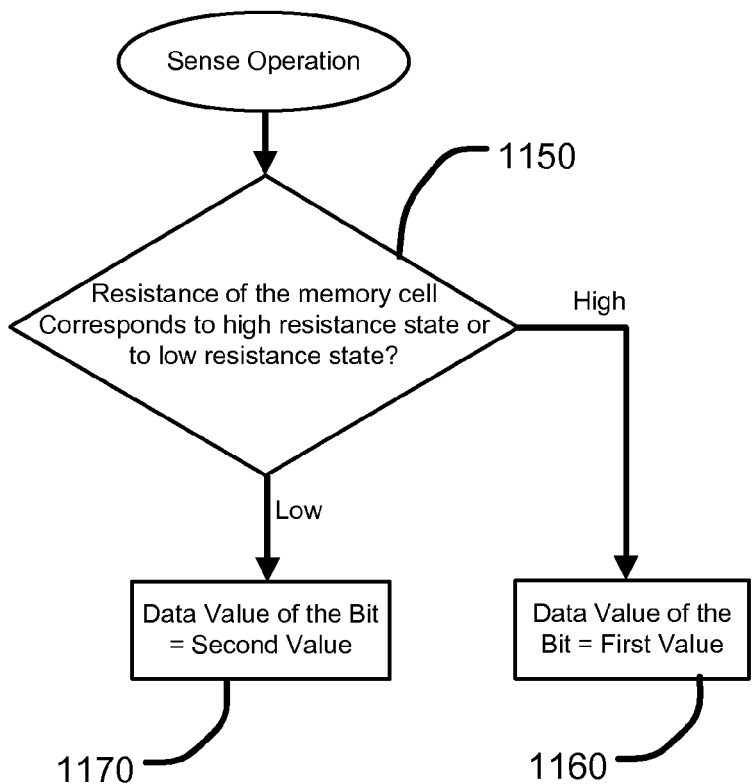
FIG. 11B illustrates a method for sensing a single bit stored in a selected memory cell having a plurality of active regions arranged in series along an inter-electrode current path.

FIG. 11B illustrates a method for sensing a bit stored in a selected memory cell having a plurality of active regions arranged in series along an inter-electrode current path. As step 1150 it is determined whether the resistance of the memory cell corresponds to the high resistance state or the low resistance state, the high resistance state having a minimum resistance indicating that at least one of the active regions is in the high resistance condition and the low resistance state having a maximum resistance indicating that at least all of the active regions are in the low resistance condition.

Thus, the method allows the data value stored to be determined even if some of the active regions have experienced the tailing bit effect. If the resistance of the memory cell corresponds to the high resistance state than at least one of the active regions is in the high resistance state and the data value sensed at step 1160 is the first value of the bit. Otherwise, the resistance of the memory cell is such that all of the active regions are in the low resistance condition and the data value sensed at step 1170 is the second value.

Figure 12:
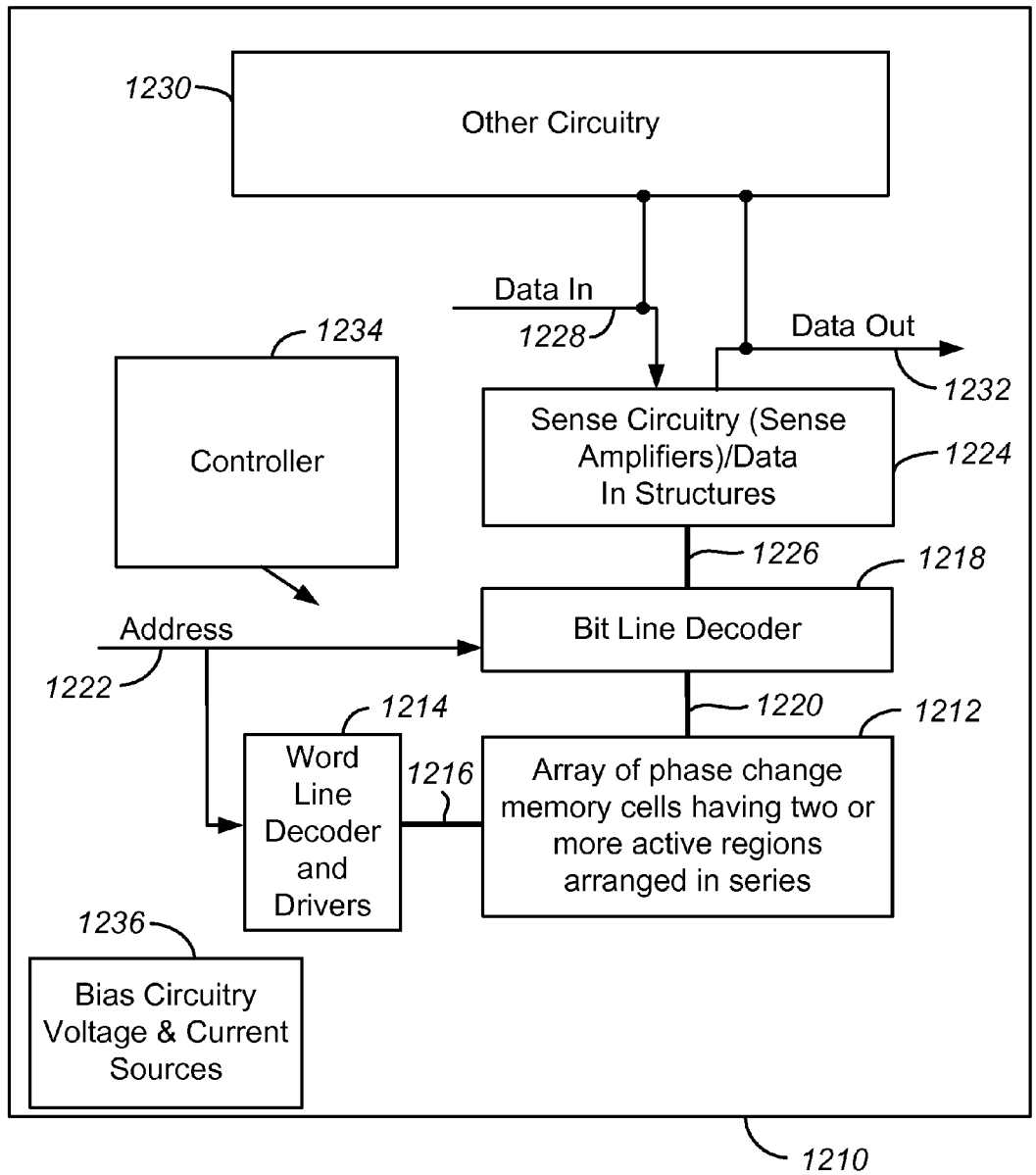
FIG. 12 is a simplified block diagram of an integrated circuit including a memory array implemented using memory cells adapted to store one bit of data and having two or more active regions arranged in series.

FIG. 12 is a simplified block diagram of an integrated circuit 1210 including a memory array 1212 implemented using memory cells adapted to store one bit of data and having two or more active regions arranged in series. A word line decoder 1214 having read, set and reset modes is coupled to and in electrical communication with a plurality of word lines 1216 arranged along rows in the memory array 1212. A bit line (column) decoder 1218 is in electrical communication with a plurality of bit lines 1220 arranged along columns in the array 1212 for reading, setting, and resetting the phase change memory cells (not shown) in array 1212. Addresses are supplied on bus 1222 to word line decoder and drivers 1214 and bit line decoder 1218. Sense circuitry (Sense amplifiers) and data-in structures in block 1224, including voltage and/or current sources for the read, set, and reset modes are coupled to bit line decoder 1218 via data bus 1226. Data is supplied via a data-in line 1228 from input/output ports on integrated circuit 1210, or from other data sources internal or external to integrated circuit 1210, to data-in structures in block 1224. Other circuitry 1230 may be included on integrated circuit 1210, such as a general purpose processor or special purpose application circuitry, or a combination of modules providing system-on-a-chip functionality supported by array 1212. Data is supplied via a data-out line 1232 from the sense amplifiers in block 1224 to input/output ports on integrated circuit 1210, or to other data destinations internal or external to integrated circuit 1210.

A controller 1234 implemented in this example, using a bias arrangement state machine, controls the application of bias circuitry voltage and current sources 1236 for the application of bias arrangements including read, program, erase, erase verify and program verify voltages and/or currents for the word lines and bit lines. Controller 1234 may be implemented using special-purpose logic circuitry as known in the art. In alternative embodiments, controller 1234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1234.

Figure 13:
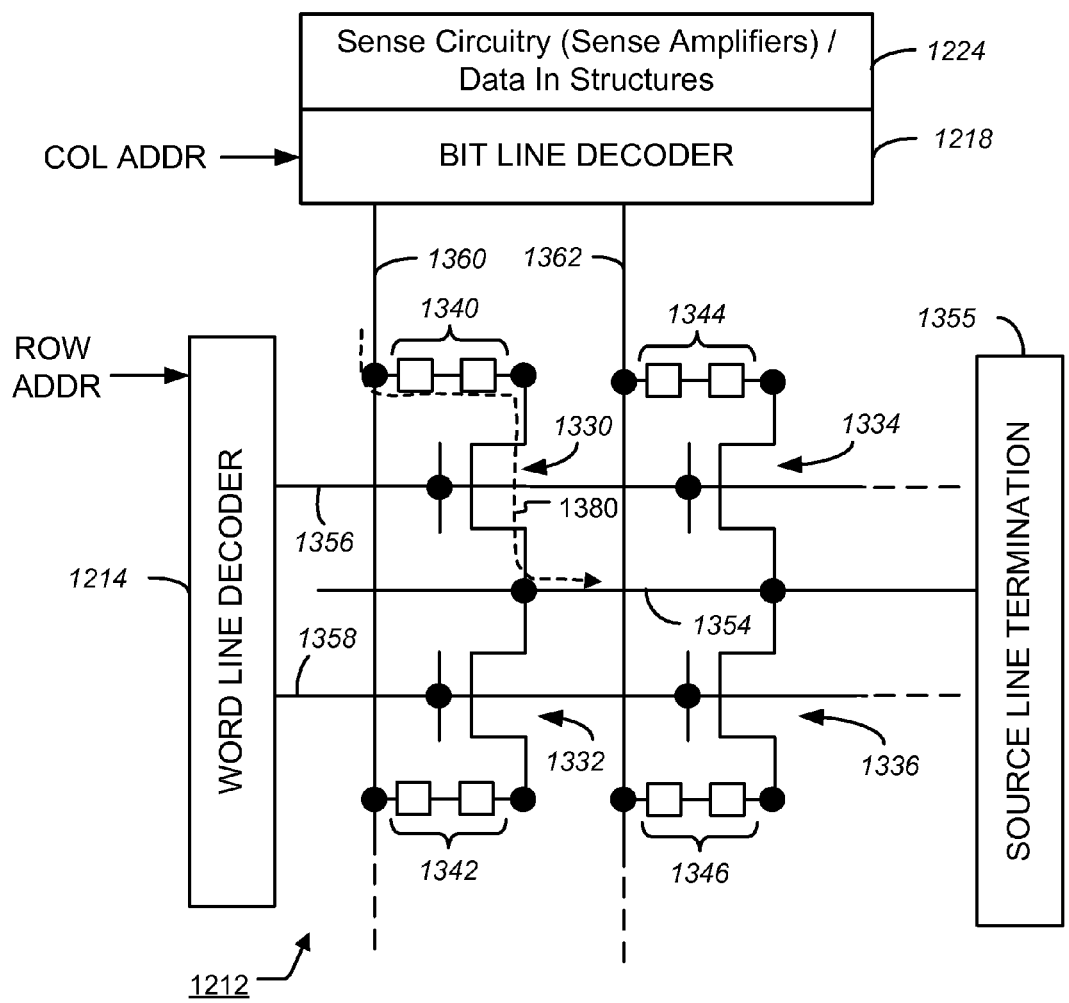
FIG. 13 illustrates a portion of the memory array.

As shown in FIG. 13, each of the memory cells of array 1212 includes an access transistor (or other access device such as a diode) and phase change material having a plurality of active regions arranged in series. In FIG. 13 four memory cells 1330, 1332, 1334, 1336 having respective plurality of active regions 1340, 1342, 1344, 1346 are illustrated, representing a small section of an array that can include millions of memory cells. In the illustration of FIG. 13 each plurality of active regions is shown containing two active regions, although it will be understood that each plurality of active regions may contain more than two active regions.

Sources of each of the access transistors of memory cells 1330, 1332, 1334, 1336 are connected in common to source line 1354 that terminates in a source line termination circuit 1355, such as a ground terminal. In another embodiment the source lines of the access devices are not electrically connected, but independently controllable. The source line termination circuit 1355 may include bias circuitry such as voltage sources and current sources, and decoding circuits for applying bias arrangements, other than ground, to the source line 1354 in some embodiments.

A plurality of word lines including word lines 1356, 1358 extend in parallel along a first direction. Word lines 1356, 1358 are in electrical communication with word line decoder 1214. The gates of access transistors of memory cells 1330 and 1334 are connected to word line 1356, and the gates of access transistors of memory cells 1332 and 1336 are connected in common to word line 1358.

A plurality of bit lines including bit lines 1360, 1362 extend in parallel in a second direction and are in electrical communication with bit line decoder 1218. In the illustrated embodiment each of the plurality of active regions are arranged between the drain of the corresponding access device and the corresponding bit line. Alternatively, the active regions may be on the source side of the corresponding access device, or on both the source and drain sides of the corresponding access device.

It will be understood that the memory array 1212 is not limited to the array configuration illustrated in FIG. 13, and additional array configurations can also be used. Additionally, instead of MOS transistors bipolar transistors or diodes may be used as access devices in some embodiments.

In operation each of the memory cells in the array 1212 store a single bit of data depending upon the total resistance of the corresponding plurality of active regions. The data value may be determined, for example, by comparison of current on a bit line for a selected memory cell to that of a suitable reference current by sense amplifiers of sense circuitry 1224. The reference current can be established to that a predetermined range of currents correspond to a logical "0", and a differing range of current correspond to a logical "1".

Reading or writing to a memory cell of array 1212, therefore, can be achieved by applying a suitable voltage to one of word lines 1358, 1356 and coupling one of bit lines 1360, 1362 to a voltage source so that current flows through the selected memory cell. For example, a current path 1380 through a selected memory cell (in this example memory cell 1330 and corresponding plurality of active regions 1340) is established by applying voltages to the bit line 1360, word line 1356, and source line 1354 sufficient to turn on the access transistor of memory cell 1330 and induce current in path 1380 to flow from the bit line 1360 to the source line 1354, or vice-versa. The level and duration of the voltages applied is dependent upon the operation performed, e.g. a reading operation or a writing operation.

In a reset (or erase) operation of the memory cell 1330, word line decoder 1214 facilitates providing word line 1356 with a suitable voltage pulse to turn on the access transistor of the memory cell 1330. Bit line decoder 1218 facilitates supplying a voltage pulse to bit line 1360 of suitable amplitude and duration to induce a current to flow though all of the plurality of active regions 1340, the current raising the temperature of all of the plurality of active regions 1340 above the transition temperature of the phase change material and also above the melting temperature to place all of the plurality of active regions in a liquid state. The current is then terminated, for example by terminating the voltage pulses on the bit line 1360 and on the word line 1356, resulting in a relatively quick quenching time as all of active regions in the plurality of active regions 1340 rapidly cool to stabilize to a high resistance generally amorphous condition and setting the memory cell to the high resistance state. The reset operation can also comprise more than one pulse, for example using a pair of pulses.

In a set (or program) operation of the selected memory cell 1330, word line decoder 1214 facilitates providing word line 1356 with a suitable voltage pulse to turn on the access transistor of the memory cell 1330. Bit line decoder 1218 facilitates supplying a voltage pulse to bit line 1360 of suitable amplitude and duration to induce a current to flow through all of the plurality of active regions 1340, the current pulse sufficient to raise the temperature of all of the active regions of the plurality of active regions 1340 above the transition temperature and cause a transition in all of the active regions of the plurality of active regions 1340 from the high resistance generally amorphous condition into a low resistance generally crystalline condition, this transition lowering the resistance of all of the plurality of active regions and setting the memory cell to the low resistance state.

In a read (or sense) operation of the data value of the bit stored in the memory cell 1330, word line decoder 1214 facilitates providing word line 1356 with a suitable voltage pulse to turn on the access transistor of the memory cell 1330. Bit line decoder 1218 facilitates supplying a voltage to bit line 1360 of suitable amplitude and duration to induce current to flow through all of the plurality of active regions 1340 that does not result in any of the active regions in the plurality of active regions 1340 undergoing a change in resistive state. The current on the bit line 1360 and through the plurality of active regions 1340 is dependent upon the resistance of, and therefore the data state associated with, the memory cell. Thus, the data state of the memory cell may be determined by detecting whether the resistance of the memory cell 1330 corresponds to the high resistance state or the low resistance state, for example by comparison of the current on bit line 1360 with a suitable reference current by sense amplifiers of sense circuitry 1224.

Figure 14:
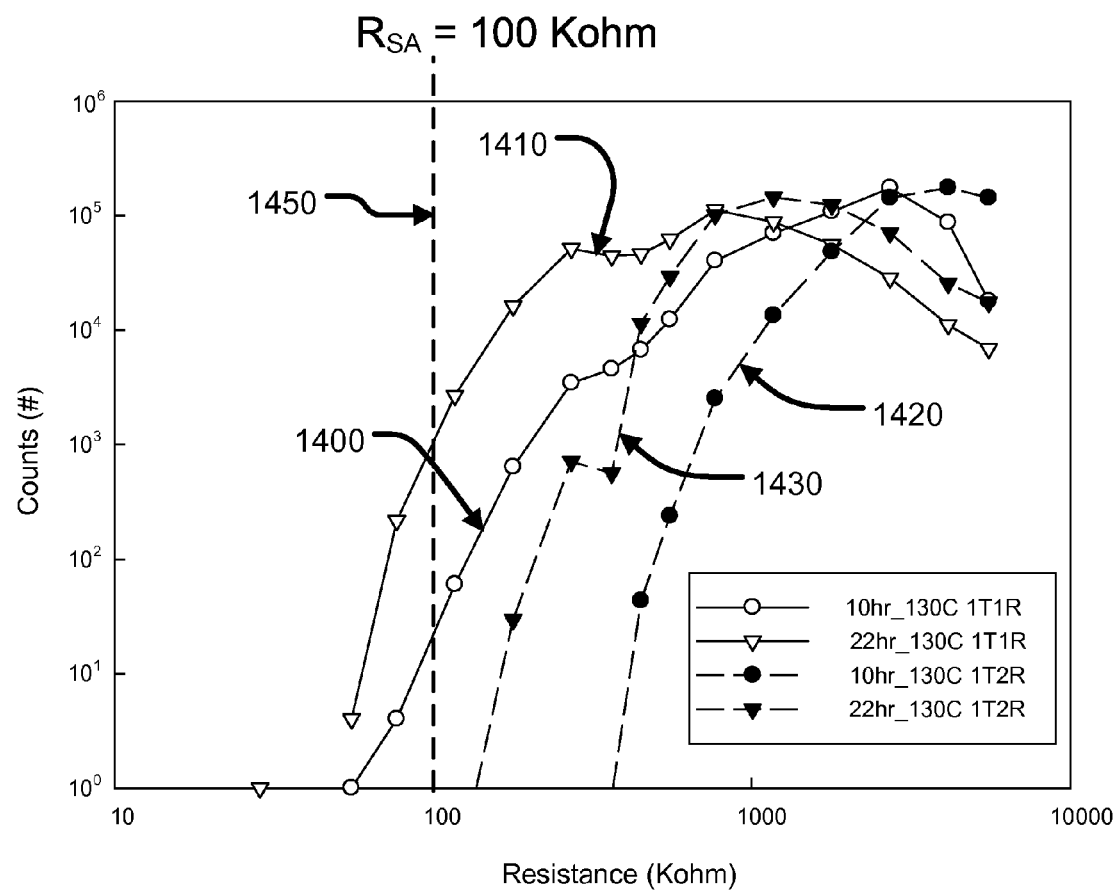
FIG. 14 illustrates the measured resistance distribution of an array of 1T1R memory cells and the computed resistance distribution of an array of 1T2R memory cells.

FIG. 14 illustrates the measured resistance distributions 1400 and 1410 of a 512 Kb array of single active region phase change memory cells with one switching device (1T1R) after baking at 130° C. for 10 hours and 22 hours respectively. The dashed line 1450 represents a threshold resistance value $R_{SA}$ of 100 Kohm used to determine the data value of a single bit stored in the memory cells. As can be seen in the Figure, the 1T1R distributions 1400 and 1410 include memory cells experiencing the tailing bit effect and having a resistance below $R_{SA}$, resulting in bit errors for those cells.

FIG. 14 also illustrates computed resistance distributions 1420 and 1430 for a simulated 256 Kb array of memory cells having two active regions arranged in series and spaced apart from one another (1T2R), the 256 Kb distributions 1420 and 1430 computed from the measured 512 Kb 1T1R array distributions 1400 and 1410 respectively. The resistance of a 1T2R memory cell within the 256 Kb array distribution 1420 is computed by summing the resistance of two 1T1R memory cells within the distribution 1400, and the resistance of a 1T2R memory cell within the 256 Kb array distribution 1430 is computed by summing the resistance of two 1T1R memory cells within the distribution 1410.

As can be seen in FIG. 11, the additional active region of the 1T2R memory cells guards the reset state of the memory cells, resulting in computed distributions 1420 and 1430 which are completely above $R_{SA}$, thus avoiding bit errors.

Figure 15B:
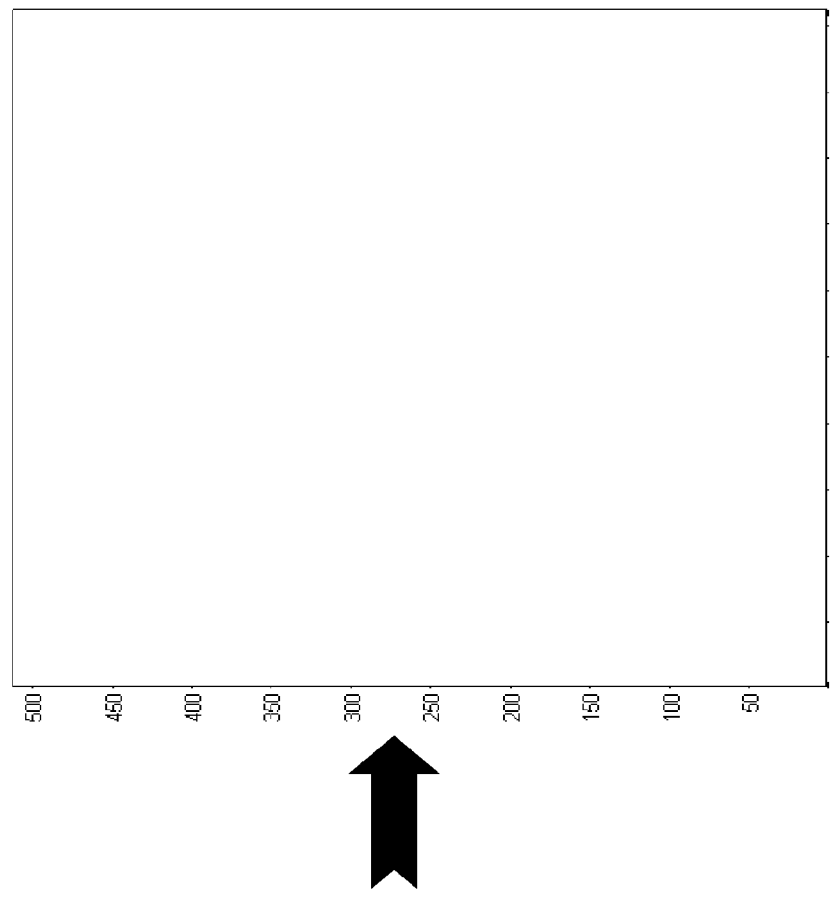
FIGS. 15A-15B further illustrate a map of an array to further illustrate the guarding effect of the second active region.
Figure 15A:
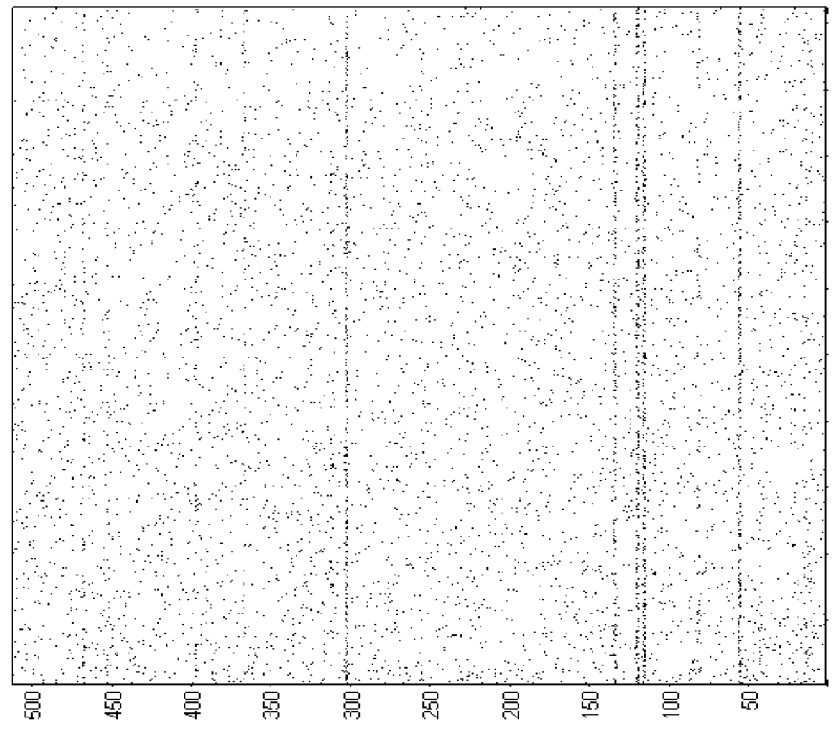

FIGS. 15A and 15B further demonstrate the guarding effect the second active region has on memory cells in the reset state. FIG. 15A is a map of an array of memory cells having a select device (such as a transistor or diode) and a single active region (1T1R), the dots on the map showing the location of the 1T1R memory cells having a resistance less than $R_{SA}$=100 Kohm after 50 hours of baking at 130° C. FIG. 15B shows the simulated result of memory cells having a select device and two active regions spaced apart and arranged in series (1T2R), the result of FIG. 15B computed from the measured data of FIG. 15A by summing the resistance of two memory cells in the array of FIG. 15B. As can be seen in FIG. 15A, none of the memory cells have a computed resistance below $R_{SA}$ after 50 hours of baking at 130° C.

Figure 16:
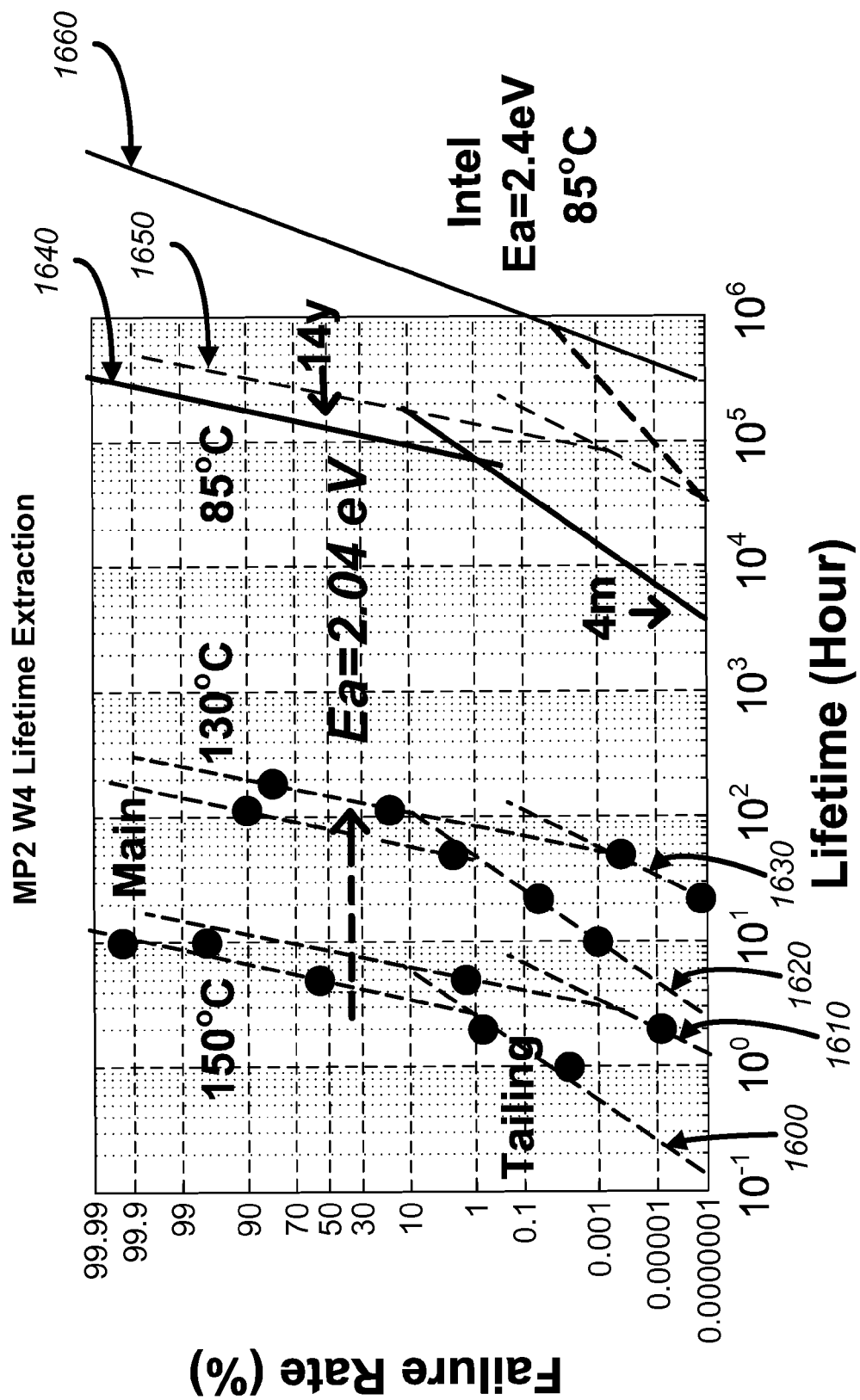
FIG. 16 illustrates a graph of the failure rate of cells in an array versus time for various temperatures for both 1T1R and 1T2R memory cells.

FIG. 16 illustrates a graph of the failure rate of cells in an array versus time for various temperatures for both 1T1R and 1T2R memory cells having memory material with a computed activation energy Ea=2.04 eV. The data points associated with dashed line 1600 represent the measured failure rate (the percentage of cells in a reset state with a resistance below a threshold value) of an array of 1T1R memory cells versus time baked at 150° C., the dashed line 1600 being a shifted curve of dashed line 1620.

Line 1610 represents the computed failure rate of an array of 1T2R memory cells baked at 150° C. using the measured data of the 1T1R memory cells associated with line 1300. As can be seen in the Figure, a significant improvement in the failure rate is achieved at 150° C. for the tailing portion of the line 1610, indicating a reduced tailing bit effect for 1T2R memory cells.

Curves 1620 and 1630 illustrate the measured failure rate of an array of 1T1R memory cells and the computed failure rate of an array of 1T2R memory cells baked at 130° C.

respectively, again showing the improved failure rate performance of the 1T2R memory cells. Additionally, curves 1640 and 1650 show the expected failure rate of the 1T1R array and the computed failure rate of the 1T2R array baked at 85° C. respectively.

FIG. 16 also includes a curve 1660 of published extrapolated failure rate data at 85° C. of a 1T1R memory cell array having a computed activation energy of 2.4 eV using measured failure rate data at 160° C., 140° C., and 125° C. See Gleixner et. al., "Data Retention Characterization of Phase-Change Memory Arrays", IEEE 45th Annual International Reliability Physics Symposium, pp. 542-546, 2007, which is incorporated by reference herein. Based on the computed results above, it is expected that a 1T2R array of memory cells will further reduce the failure rate of the 1T1R memory cells of curve 1660.

FIG. 17-22 illustrate cross-sectional views of memory cells comprising phase change material having first and second active regions arranged in series along an inter-electrode current path between first and second electrodes, which may be implemented in array of array 1212 of FIG. 12.

Figure 17:
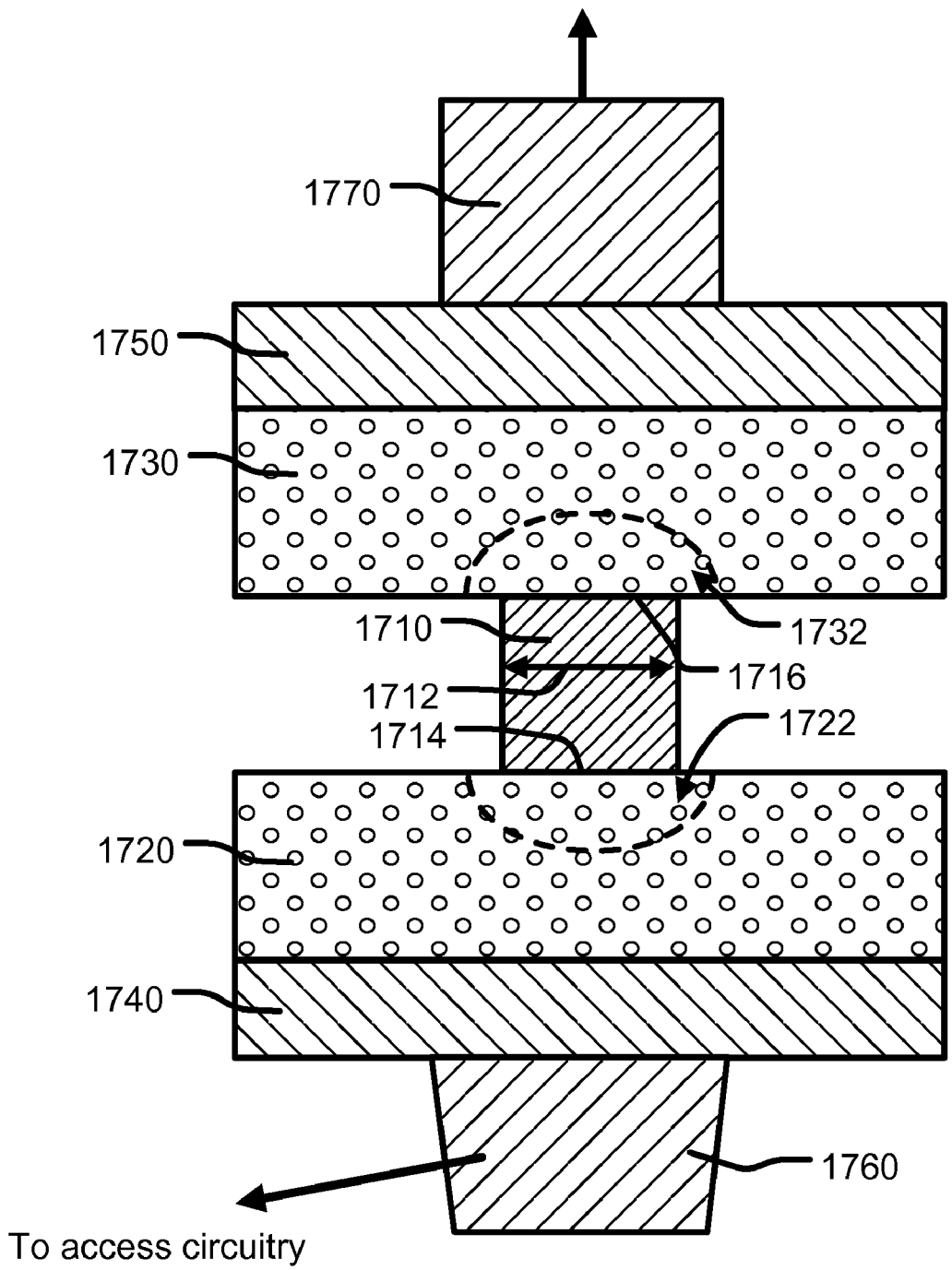
FIG. 17 illustrates a cross-sectional view of a first memory cell having first and second active regions arranged in series along an inter-electrode current path between first and second electrodes.

FIG. 17 illustrates a cross-sectional view of a first memory cell 1700 having first and second active regions 1722, 1732 arranged in series along an inter-electrode current path between a first electrode 1740 and a second electrode 1750.

The memory cell includes a first memory element 1720 comprising phase change material on the first electrode 1740, and second memory element 1730 comprising phase change material underlying the second electrode 1750. The memory elements 1720, 1730 may each comprise, for example, one or more materials from the group of Ge, Sb, Te, Se, In, Ti, Ga, Bi, Sn, Cu, Pd, Pb, Ag, S, Si, O, P, As, N and Au The memory cell 1700 also includes an inner electrode 1710 contacting the first memory element 1720 at a first contact surface 1714 and contacting the second memory element 1730 at a second contact surface 1716, the inner electrode 1710 surrounded by dielectric (not shown) and electrically coupling the first memory element 1720 to the second memory element 1730.

The first and second electrodes 1740, 1750 and the inner electrode 1710 may each comprise, for example, TiN or TaN. TiN may be preferred in embodiments in which the memory elements 1720, 1730 each comprise GST (discussed below) because is makes a good contact with GST, it is a common material used in semiconductor manufacturing, and it provides a good diffusion barrier at the higher temperatures at which GST transitions, typically in the 600-7000 C range. Alternatively, the top and bottom electrodes 1750, 1740 and the inner electrode 1710 may be TiAlN or TaAlN, or comprises, for further examples, one or more elements selected from the group consisting of Ti, W, Mo, Al, Ta, Cu, Pt, Ir, La, Ni, N, O, and Ru and combinations thereof. The inner electrode 1710 may also comprise a material having a resistivity greater than the highest resistive state of the materials of the first and second memory elements 1720, 1730, the larger resistivity allowing the inner electrode 1710 to act as a heater and result in a larger temperature change in the active regions 1722, 1732 for a given current density.

A conductive contact 1760 couples the memory cell 1700 to access circuitry such as a transistor or diode, the conductive contact 1760 comprising a refractory metal such as tungsten in the illustrated embodiment. Other metals that could be used include Ti, Mo, Al, Ta, Cu, Pt, Ir, La, Ni, and Ru. Other contact structures and materials can be used as well. For example, the conductive contact 1760 may comprise a doped semiconductor material which is a drain or source region of an access transistor.

The memory cell 1700 also includes a conductive via 1770 extending through dielectric (not shown) to couple the second electrode 1750 to a bit line or ground for example. The conductive via 1770 may comprise, for example, any of the materials discussed above with reference to the conductive contact 1760. Alternatively, the conductive via 1770 may be omitted and the second electrode 1750 may comprise a portion of a bit line.

In operation, voltages on the conductive via 1770 and contact 1760 can induce a current to flow along an inter-electrode current path from the first electrode 1740 to the second electrode 1750, or vice versa, via the first memory element 1720, the inner electrode 1710, and the second memory element 1730.

The inner electrode 1710 has a width 1712 (which in some embodiments is a diameter) less than that of the first and second electrodes 1740, 1750 and the first and second memory elements 1720, 1730. This difference in width concentrates current density in the regions of the first and second memory elements 1720, 1730 adjacent the inner electrode 1710, resulting in the first and second active regions 1722, 1732 adjacent respective contact surfaces 1714, 1716 as shown in the Figure. As can be seen in FIG. 17, the active regions 1722, 1732 are spaced apart from one another and arranged in series. When the reset state is established in the memory cell 1700, both of the active regions 1722 and 1732 are in a high resistance generally amorphous condition. Thus, the memory cell 1700 has a significantly reduced probability of experiencing the tailing bit effect and has improved failure rate performance over memory cells having only a single active region.

Embodiments of the memory cell 1700 include phase change based memory materials, including chalcogenide based materials and other materials, for the memory elements 1720, 1730 respectively. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has a bistable or multi-stable resistance state controlled by an electrical pulse.

An exemplary method for forming chalcogenide material uses PVD-sputtering or magnetron-sputtering method with source gas(es) of Ar, N2, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

FIGS. 18-22 also illustrate memory cells having first and second regions arranged in series. As will be understood, the materials described above with reference to elements of the memory cell of FIG. 17 may be implemented in the memory cells of FIGS. 18-22, and thus a detailed description of these materials is not repeated.

Figure 18:
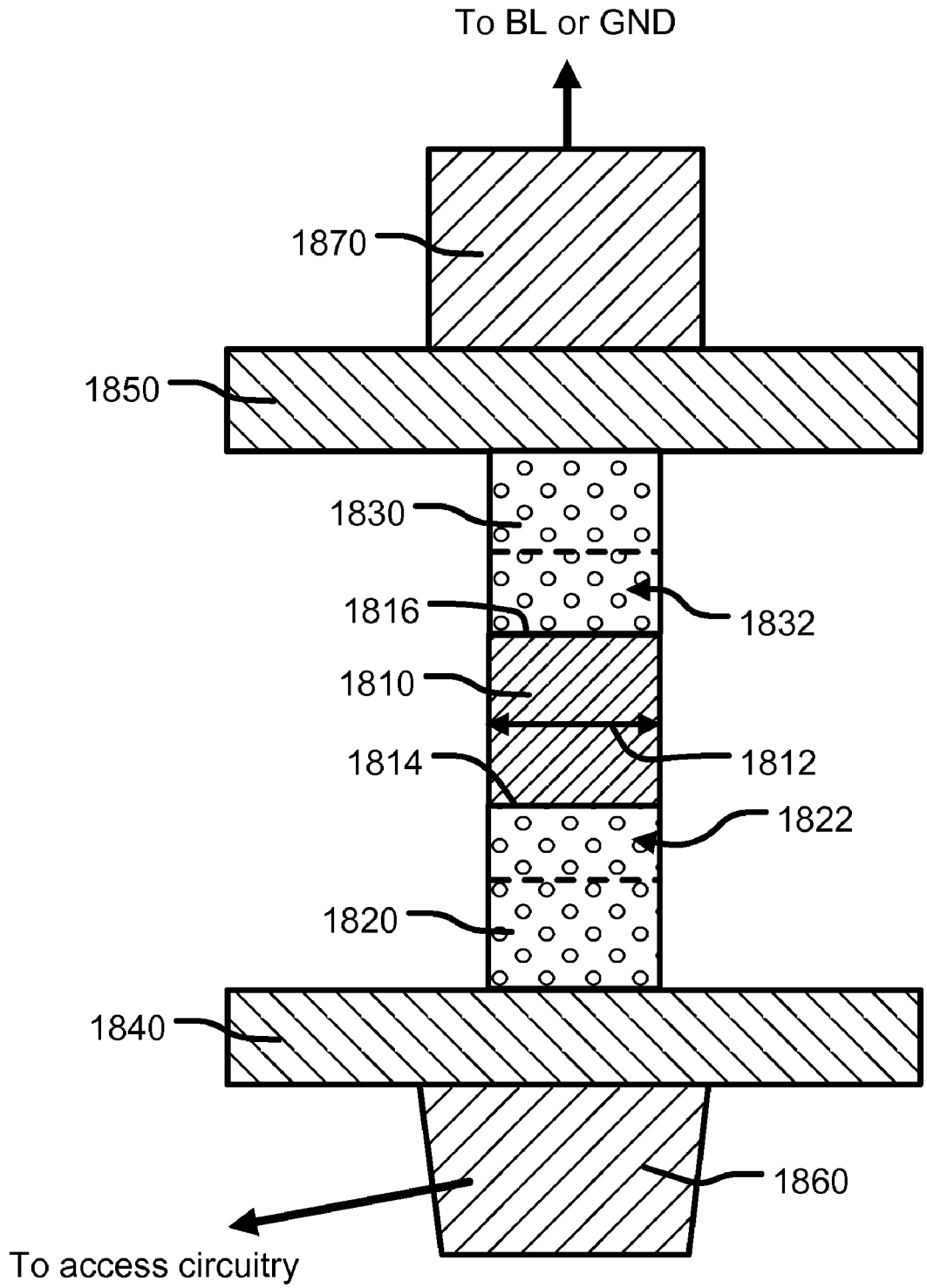
FIG. 18 illustrates a cross-sectional view of a second memory cell having first and second active regions arranged in series along an inter-electrode current path between first and second electrodes.

FIG. 18 illustrates a cross-sectional view of a second memory cell 1800 having first and second active regions 1822, 1832 arranged in series along an inter-electrode current path between a first electrode 1840 and a second electrode 1850.

The memory cell 1800 includes a first memory element 1820 comprising phase change material on the first electrode 1840, and a second memory element 1830 underlying the second electrode 1850.

The memory cell 1800 also includes an inner electrode 1810 contacting the first memory element 1820 at a first contact surface 1814 and contacting the second electrode at a second contact surface 1816. The first and second memory elements 1820, 1830 and the inner electrode 1810 form a multi-layer pillar surrounded by dielectric (not shown), the multi-layer pillar electrically coupling the first and second electrodes 1840, 1850.

A conductive contact 1860 couples the memory cell 1800 to access circuitry such as a transistor or diode. Other contact structures can be used as well. For example, the conductive contact 1860 may comprise a doped semiconductor material which is a drain or source region of an access transistor.

The memory cell 1800 also includes a conductive via 1870 extending through dielectric (not shown) to couple the second electrode 1850 to a bit line or ground for example. Alternatively, the conductive via 1870 may be omitted and the second electrode 1850 may comprise a portion of a bit line.

In operation, voltages on the conductive via 1870 and contact 1860 can induce a current to flow along an inter-electrode current path from the first electrode 1840 to the second electrode 1850, or vice versa, via the first memory element 1820, the inner electrode 1810, and the second memory element 1830.

The inner electrode 1810 has a width 1812 (which in some embodiments is a diameter) substantially the same as that of the first and second memory elements. As used herein, the term "substantially" is intended to accommodate manufacturing tolerances. The inner electrode 1810 also has a width less than that of the first and second electrodes 1840, 1850, resulting in the current density in operation to be concentrated in the multi-layer pillar. In some embodiments the inner electrode 1810 comprises a heater material, resulting in the active regions 1822, 1832 adjacent the respective contact surfaces 1814, 1816.

Figure 19:
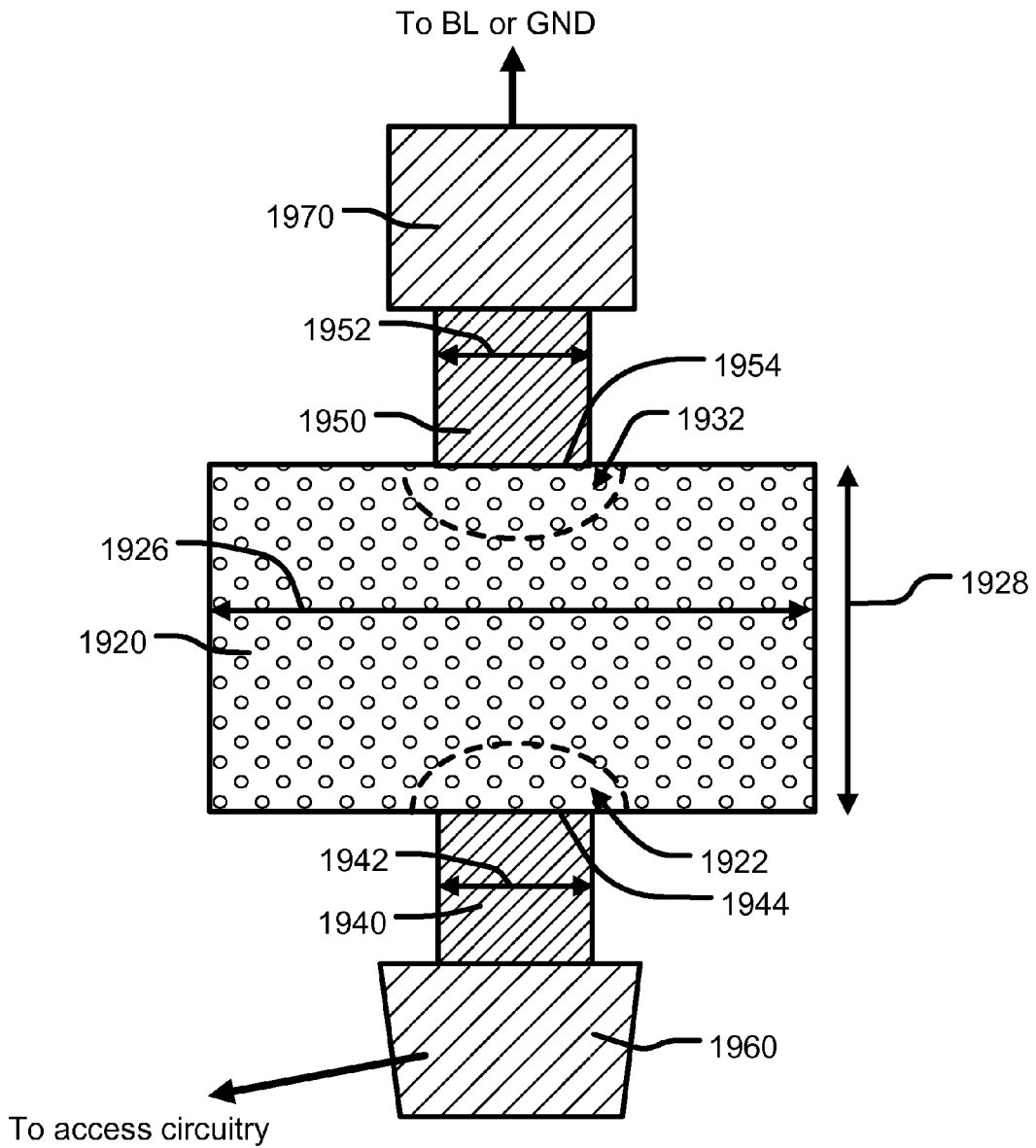
FIG. 19 illustrates a cross-sectional view of a third memory cell having first and second active regions arranged in series along an inter-electrode current path between first and second electrodes.

FIG. 19 illustrates a cross-sectional view of a third memory cell 1900 having first and second active regions 1922, 1932 arranged in series along an inter-electrode current path between a first electrode 1940 and a second electrode 1950.

The memory cell 1900 includes a memory element 1920 comprising phase change material electrically coupling the first electrode 1940 and the second electrode 1950. The first electrode 1940 contacts the memory element 1920 at first contact surface 1944, and the second electrode 1950 contacts the memory element 1920 at a second contact surface 1954.

The memory element 1920 has a width 1926 greater than the width 1942 of the first electrode 1940 and greater than the width 1952 of the top electrode 1950. This difference in widths concentrates current density in the regions of memory element 1920 adjacent the first and second electrodes 1940, 1950. Additionally, the memory element 1920 has a thickness 1928 sufficient to separate the generally amorphous active regions 1920, 1930 when the memory cell 1900 is in the reset state.

A conductive contact 1960 couples the memory cell 1900 to access circuitry such as a transistor or diode. Other contact structures can be used as well. For example, the conductive contact 1960 may comprise a doped semiconductor material which is a drain or source region of an access transistor.

The memory cell 1900 also includes a conductive via 1970 extending through dielectric (not shown) to couple the second electrode 1950 to a bit line or ground for example. Alternatively, the conductive via 1970 may be omitted and the second electrode 1950 may comprise a portion of a bit line.

In operation, voltages on the conductive via 1970 and contact 1960 can induce a current to flow along an inter-electrode current path from the first electrode 1940 to the second electrode 1950, or vice versa, via the memory element 1920.

Figure 20:
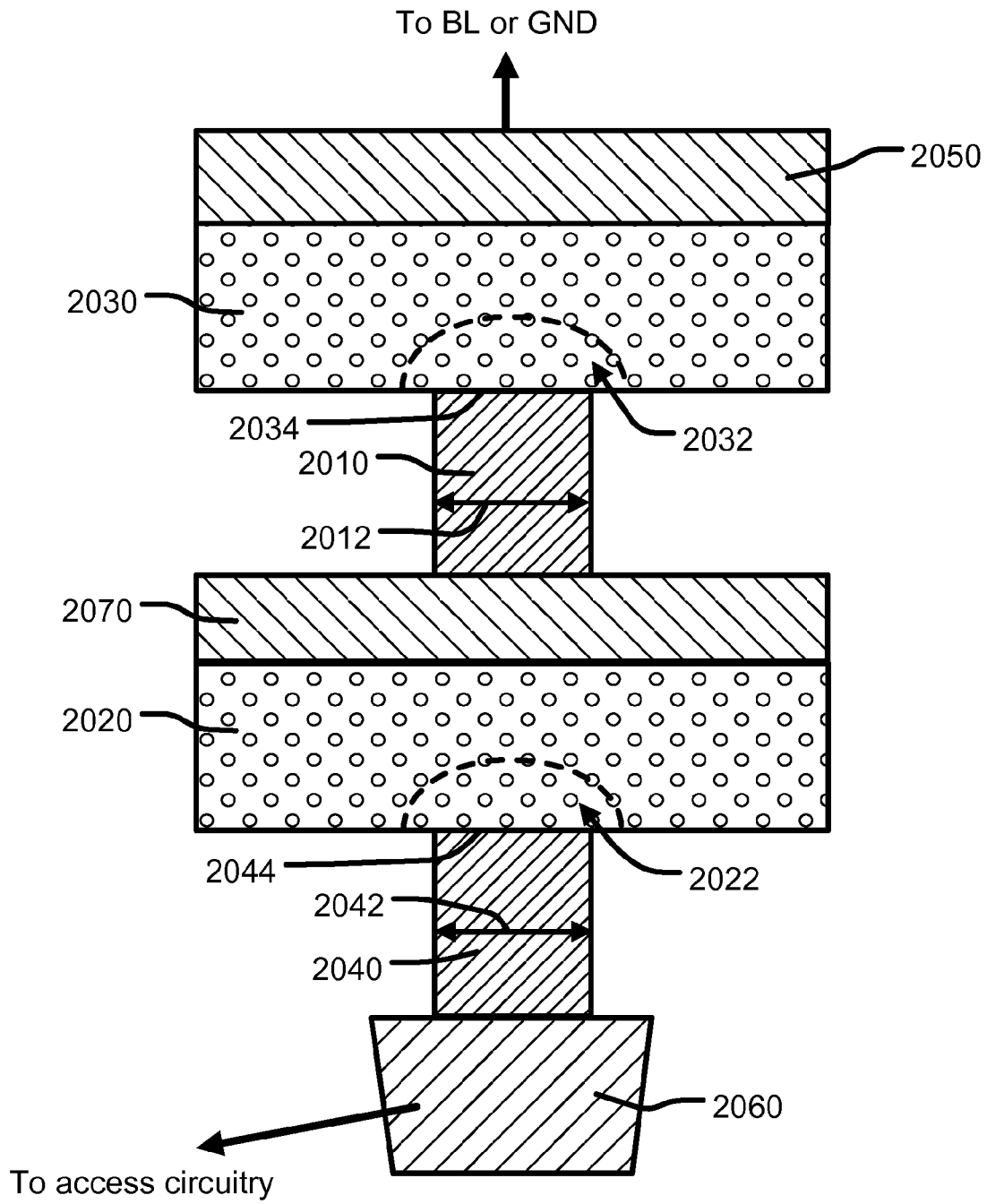
FIG. 20 illustrates a cross-sectional view of a fourth memory cell having first and second active regions arranged in series along an inter-electrode current path between first and second electrodes.

FIG. 20 illustrates a cross-sectional view of a fourth memory cell 2000 having first and second active regions 2022, 2032 arranged in series along an inter-electrode current path between a first electrode 2040 and a second electrode 2050.

The memory cell 2000 includes first memory element 2020 contacting first electrode 2040 at first contact surface 2044, and a conductive electrode 2070 on the memory element 2020. The first electrode 2040 has a width 2042 less than that of the first memory element 2020 and the electrode 2070. This difference in width concentrates the current density in the portion of the memory element 2020 adjacent the first electrode 2040, resulting in the active region 2022 adjacent the first contact surface 2044 as shown.

An inner electrode 2010 contacts second memory element 2030 at second contact surface 2034 and couples the second memory element 2030 to the electrode 2070. The inner electrode 2010 has a width 2012 less than that of the second memory element 2030 and second electrode 2050. This difference in width concentrates the current density in the portion of the second memory element 2030 adjacent the inner electrode 2010, resulting in the active region 2032 adjacent the second contact surface 2034 as shown.

A conductive contact 2060 couples the memory cell 2000 to access circuitry such as a transistor or diode. Other contact structures can be used as well. For example, the conductive contact 2060 may comprise a doped semiconductor material which is a drain or source region of an access transistor.

The second electrode 2050 is coupled to a bit line or ground by a conductive via for example. Alternatively, the second electrode 1850 may comprise a portion of a bit line.

Figure 21:
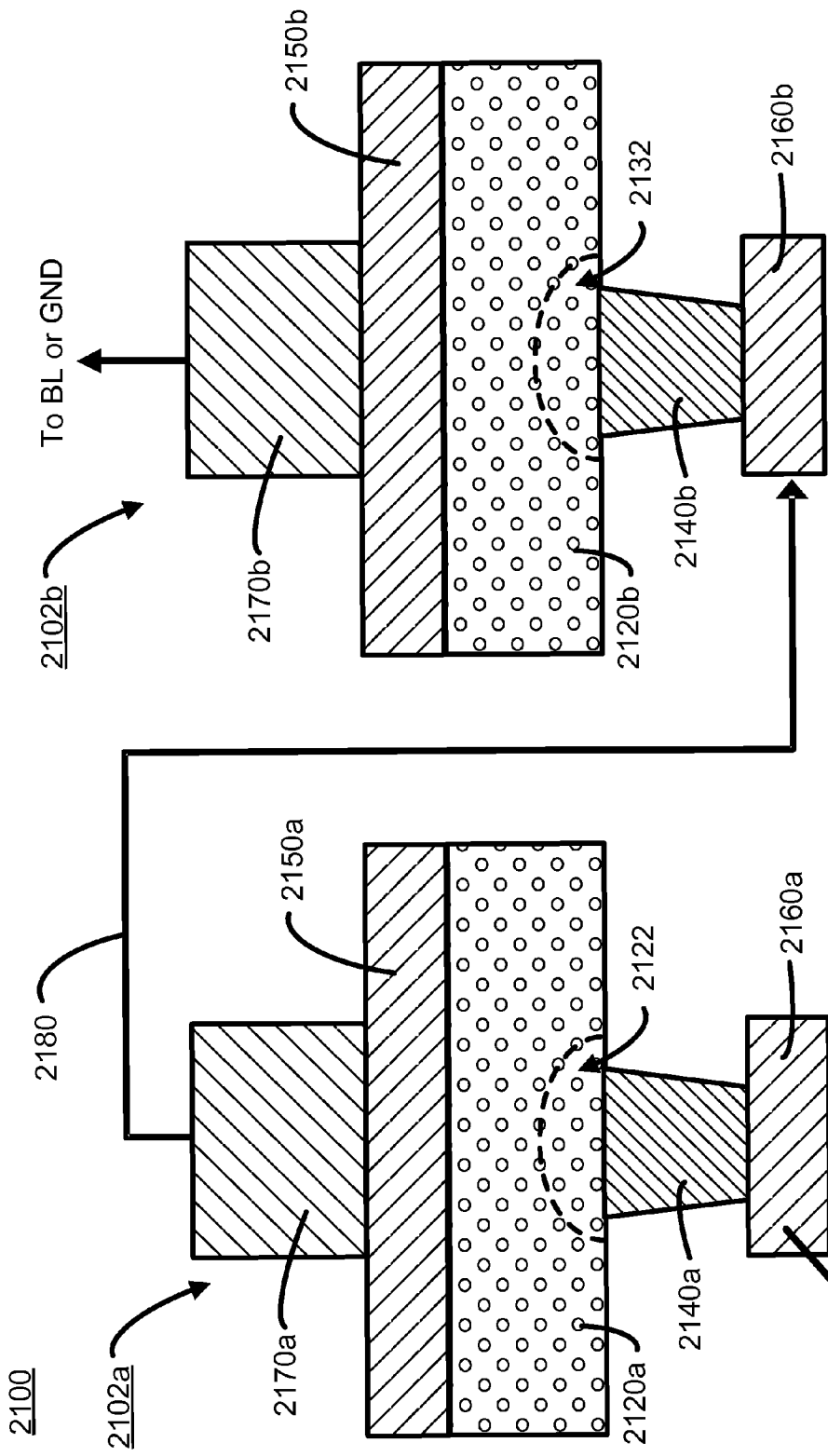
FIG. 21 illustrates a cross-sectional view of a fifth memory cell having first and second active regions arranged in series along an inter-electrode current path between first and second electrodes.
Figure 22:
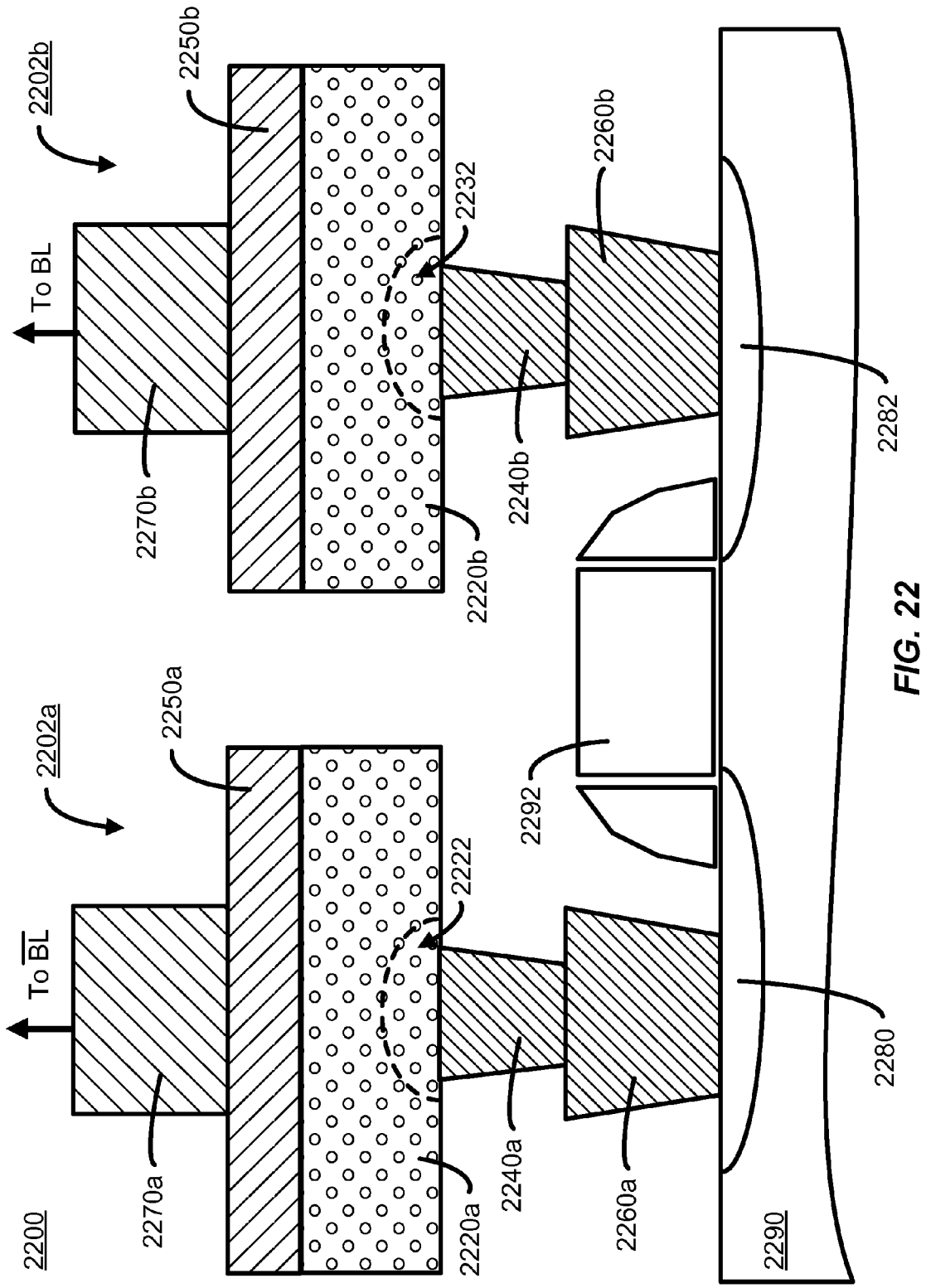
FIG. 22 illustrates a cross-sectional view of a sixth memory cell having first and second active regions arranged in series along an inter-electrode current path between first and second electrodes.

In the memory cells of FIGS. 17-20 the active regions are on different planes such that one active region overlies the other active region. FIGS. 21-22 illustrate memory cells in which the first and second active regions 1020, 1030 are physically spaced apart from each other but located within the same physical plane.

FIG. 21 illustrates a cross-sectional view of a fifth memory cell 2100 having first and second active regions 2122, 2132 arranged in series along an inter-electrode current path between a first electrode 2140a and a second electrode 2150b.

Memory cell 2100 includes first and second portions 2102a and 2102b physically located in the same plane and electrically coupled to each other as represented by line 2180. The electrical coupling represented by line 2180 can be achieved using various techniques such as conductive lines and/or contacts The first and second portions 2102a and 2108b are substantially the same, where the term "substantially" is intended to accommodate manufacturing tolerances. Each portion 2102 of the memory cell 2100 includes a conductive contact 2160, a bottom electrode 2140 on the conductive contact 2160, a memory element 2120 on the bottom electrode 2140, a top electrode 2150 on the memory element 2120, and a conductive via 2170 on the top electrode 2150.

The bottom electrodes 2140 have a width less than that of the memory elements 2120 and the top electrodes 2150. In operation this difference in width concentrates the current density to the portion of the memory elements 2120 adjacent the bottom electrode 2140, resulting in active region 2122 within memory element 2120a and active region 2132 within memory element 2120b as shown in the Figure.

FIG. 22 illustrates a cross-sectional view of a sixth memory cell having first and second active regions 2222, 2232 arranged in series along an inter-electrode current path between a first electrode 2240a and a second electrode 2250b.

Memory cell 2200 includes first and second portions 2202a and 2202b physically located in the same plane, the first portion 2202a coupled to the source of a transistor and the second portion 2202b coupled to the drain of the transistor.

The first and second portions 2202a and 2202b are substantially the same, where the term "substantially" is intended to accommodate manufacturing tolerances. Each portion 2202 of the memory cell 2200 includes a conductive contact 2260, a bottom electrode 2240 on the conductive contact 2260, a memory element 2220 on the bottom electrode 2240, a top electrode 2250 on the memory element 2220, and a conductive via 2270 on the top electrode 2250.

The conductive contact 2260a is coupled to doped region 2280 within a semiconductor substrate 2290, doped region 2280 acting as the source of a transistor select device. The conductive contact 2260b is coupled to doped region 2282 within semiconductor substrate 2290, doped region 2282 acting as the drain region of the transistor. The transistor also includes a gate 2292 (which may comprise a portion of a word line) overlying the substrate 2290.

The conductive via 2270a is coupled to a first bit line, and the conductive via 1970b is coupled to a second bit line.

In operation, voltages on the gate 2292 and the first and second bit lines can induce a current from the second portion 2202b to the first portion 2202a, or vice versa, via the transistor. The bottom electrodes 2240 have a width less than that of the memory elements 2220 and the top electrodes 2250. This difference in width concentrates the current density to the portion of the memory elements 2220 adjacent the bottom electrode 2240, resulting in active region 2222 within memory element 2220a and active region 2232 within memory element 2220b as shown in the Figure.

The memory cells illustrated in FIGS. 17-22 include two active regions which are in a high resistance generally amorphous condition when the high resistance state is established in the memory cell, thus addressing the issues of tailing bits and resulting in reduced failure rate for memory cell arrays. However, it will be understood that the present invention also includes memory cells having more than two active regions arranged in series and each spaced apart from each other, all of the more than two active regions in a high resistance generally amorphous condition when the high resistance reset state is established in the memory cell. For example, the structures illustrated in FIGS. 17-22 may be serially repeated and/or combined in series to obtain more than two active regions arranged in series.

Generally, the two or more active regions of memory cells described herein may be electrically arranged in series and coupled to a terminal of a select device such as a field effect transistor, bipolar junction transistor, or diode (for example a drain or source of a select transistor), and/or may be coupled to different terminals of the select device (for example one or more active regions coupled to the drain and one or more active regions coupled to the source).

Also, the two or more active regions of memory cells described herein may be physically arranged in the same plane and electrically coupled to each other in series, and/or may be arranged in different planes and electrically coupled to each other in series.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention.

What is claimed is:

1. A memory device comprising:
    a memory cell comprising a first electrode, a second electrode, and phase change material having first and second active regions arranged in series along an inter-electrode current path between the first electrode and the second electrode;
    bias circuitry adapted to apply bias arrangements to the memory cell to store a bit, the bias arrangements including:
        a first bias arrangement adapted to establish a high resistance state in the memory cell by inducing a high resistance condition in both the first and second active regions to store a first value of the bit in the memory cell, the high resistance state having a minimum resistance indicating that at least one of the active regions is in the high resistance condition, and
        a second bias arrangement adapted to establish a low resistance state in the memory cell by inducing a low resistance condition in both the first and second active regions to store a second value of the bit in the memory cell, the low resistance state having a maximum resistance indicating that both the first and second active regions are in the low resistance condition; and
    sense circuitry to sense the value of the bit in the memory cell by determining whether the memory cell has a resistance corresponding to the low resistance state or to the high resistance state.

2. The device of claim 1, wherein the memory cell further comprises a diode having a first terminal and a second terminal, the first active region coupled to the first terminal and the second active region coupled to the second terminal.

3. The device of claim 1, wherein the memory cell further comprises a transistor having a drain terminal and a source terminal, the first active region coupled to the drain terminal and the second active region coupled to the source terminal.

4. The device of claim 1, wherein the memory cell further comprises a bipolar junction transistor having an emitter terminal and a collector terminal, the first active region coupled to the emitter terminal and the second active region coupled to the collector terminal.

5. The device of claim 1, wherein the memory cell further comprises a bipolar junction transistor having an emitter terminal and a collector terminal, the first active region coupled to the emitter terminal, and the second active region coupled to the emitter terminal via the first active region.

6. The device of claim 1, wherein the memory cell further comprises a bipolar junction transistor having an emitter terminal and a collector terminal, the first active region coupled to the collector terminal, and the second active region coupled to the collector terminal via the first active region.

7. The device of claim 1, wherein the memory cell further comprises a transistor having a drain terminal and a source terminal, the second active region coupled to the source terminal via the first active region.

8. The device of claim 1, wherein the memory cell further comprises a transistor having a drain terminal and a source terminal, the second active region coupled to the drain terminal via the first active region.

9. The device of claim 1, wherein:
    the memory cell further comprises a memory element comprising the phase change material, the first and second active regions within the memory element;
    the first electrode contacting the memory element at a first contact surface, the first electrode having a width less than that of the memory element such that the first active region is adjacent the first contact surface; and
    the second electrode contacting the memory element at a second contact surface, the second electrode having a width less than that of the memory element such that the second active region is adjacent the second contact surface.

10. The device of claim 1, wherein the memory cell further comprises a first memory element comprising a portion of the phase change material and a second memory element comprising a portion of the phase change material, the first active region within the first memory element and the second active region within the second memory element.

11. The device of claim 10, wherein:
    the first memory element contacts the first electrode;
    the second memory element contacts the second electrode; and
    the memory cell further comprises an inner electrode arranged along the inter-electrode current path between the first and second memory elements.

12. The device of claim 11, wherein:
    the inner electrode contacts the first memory element at a first contact surface and contacts the second memory element at a second contact surface;
    the first memory element has a width greater than that of the inner electrode such that the first active region is adjacent the first contact surface; and
    the second memory element has a width greater than that of the inner electrode such that the second active region is adjacent the second contact surface.

13. The device of claim 11, wherein:
the first electrode contacts the first memory element at a first contact surface, the first electrode having a width less than that of the first memory element such that the first active region is adjacent the first contact surface;
the memory cell further comprises a conductive electrode on the first memory element, the conductive electrode having a width greater than that of the first electrode;
the inner electrode on the conductive electrode and contacting the second memory element at a second contact surface, the inner electrode having a width less than that of the conductive electrode such that the second active region is adjacent the second contact surface.

14. The device of claim 1, wherein the first and second active regions are located in the same plane.

15. The device of claim 1, wherein the first active region overlies the second active region.

16. The device of claim 1, wherein the memory cell further comprises a diode having a first terminal and a second terminal, the first active region coupled to the first terminal via the second active region.

17. A method for operating a memory cell comprising a first electrode, a second electrode, and phase change material having first and second active regions arranged in series along an inter-electrode current path between the first electrode and the second electrode, the method comprising:
determining a data value of a bit to be stored in the memory cell;
applying a first bias arrangement to the memory cell if the data value is a first value, the first bias arrangement adapted to establish a high resistance state in the memory cell by inducing a high resistance condition in both the first and second active regions to store the first value of the bit, the high resistance state having a minimum resistance indicating that at least one of the active regions is in the high resistance condition;
applying a second bias arrangement to the memory cell if the data value is a second value, the second bias arrangement adapted to establish a low resistance state in the memory cell by inducing a low resistance condition in both the first and second active regions to store the second value of the bit, the low resistance state having a maximum resistance indicating that both the first and second active regions are in the low resistance state; and
determining the data value of the bit stored in the memory cell by determining whether the memory cell has a resistance corresponding to the low resistance state or to the high resistance state.

18. The method of claim 17, wherein the determining the data value of the bit stored in the memory cell comprises applying a third bias arrangement to the memory cell and detecting a current in the memory cell, the current in the memory cell corresponding to the data value of the bit stored in the memory cell.

19. The method of claim 17, wherein the memory cell further comprises a diode having a first terminal and a second terminal, the first active region coupled to the first terminal and the second active region coupled to the second terminal.

20. The method of claim 17, wherein the memory cell further comprises a transistor having a drain terminal and a source terminal, the first active region coupled to the drain terminal and the second active region coupled to the source terminal.

21. The method of claim 17, wherein the memory cell further comprises a bipolar junction transistor having an emitter terminal and a collector terminal, the first active region coupled to the emitter terminal and the second active region coupled to the collector terminal.

22. The method of claim 17, wherein the memory cell further comprises a transistor having a drain terminal and a source terminal, the second active region coupled to the source terminal via the first active region.

23. The method of claim 17, wherein the memory cell further comprises a transistor having a drain terminal and a source terminal, the first active region coupled to the source terminal and the second active region coupled to the source terminal.

24. The method of claim 17, wherein the memory cell further comprises a bipolar junction transistor having an emitter terminal and a collector terminal, the first active region coupled to the emitter terminal, and the second active region coupled to the emitter terminal via the first active region.

25. The method of claim 17, wherein the memory cell further comprises a bipolar junction transistor having an emitter terminal and a collector terminal, the first active region coupled to the collector terminal, and the second active region coupled to the collector terminal via the first active region.

26. The method of claim 17, wherein the memory cell further comprises a diode having a first terminal and a second terminal, the first active region coupled to the first terminal via the second active region.

* * * * *